(12) United States Patent
Miyata

(10) Patent No.: US 7,592,190 B2
(45) Date of Patent: Sep. 22, 2009

(54) METHOD OF EVALUATING CHARACTERISTICS OF AND FORMING OF AN INSULATING FILM FOR A SEMICONDUCTOR DEVICE

(75) Inventor: Masayasu Miyata, Suwa (JP)

(73) Assignee: Seiko Epson Corporation (JP)

(*) Notice: Subject to any disclaimer, the term of this patent is extended or adjusted under 35 U.S.C. 154(b) by 349 days.

(21) Appl. No.: 11/632,748

(22) PCT Filed: Jun. 1, 2005

(86) PCT No.: PCT/JP2005/010446

§ 371 (c)(1),
(2), (4) Date: Jan. 18, 2007

(87) PCT Pub. No.: WO2006/008882

PCT Pub. Date: Jan. 26, 2006

(65) Prior Publication Data

US 2007/0243642 A1     Oct. 18, 2007

(30) Foreign Application Priority Data

Jul. 21, 2004   (JP)   ............................. 2004-212607

(51) Int. Cl.
*H01L 21/00* (2006.01)
*G01R 3/26* (2006.01)
(52) U.S. Cl. .......................................... 438/5; 438/10
(58) Field of Classification Search ............. 438/14–15, 438/17–18

See application file for complete search history.

(56) References Cited

U.S. PATENT DOCUMENTS 5,972,765 A     10/1999   Clark et al.

(Continued)

FOREIGN PATENT DOCUMENTS

EP     0892424 A     1/1999

(Continued)

OTHER PUBLICATIONS

Ikeda et al, Characteristics of Silicon Dioxide Film Prepared by Atmospheric-Pressure Chemical Vapor Deposition Using Tetraethoxysilane and Ozone with Alcohol Addition, Apr. 1995, Jpn. J. Appli. Phys., vol. 34, pp. 2182-2190.*

(Continued)

*Primary Examiner*—Ha Tran T Nguyen
*Assistant Examiner*—Valerie Brown
(74) *Attorney, Agent, or Firm*—Harness, Dickey & Pierce, P.L.C.

(57) ABSTRACT

A method of evaluating characteristics of an insulating film 1 is disclosed. The insulating film 1 is formed of an insulative inorganic material as a main material, the insulative inorganic material containing silicon and oxygen. The insulating film 1 further contains hydrogen atoms. The method includes the steps of: analyzing the insulating film 1 to which an electric field has never been applied by Thermal Desorption Spectroscopy; comparing intensity of an $H_2$ fragment with intensity of an OH fragment, the intensity of the $H_2$ fragment and the intensity of the OH fragment being measured at a state where the insulating film 1 is heated at a temperature in the range of 500 to 1000° C.; and evaluating the characteristics of the insulating film 1 on the basis of the comparison result.

17 Claims, 10 Drawing Sheets

U.S. PATENT DOCUMENTS

| | | | |
|---|---|---|---|
| 6,037,278 | A | 3/2000 | Koyanagi et al. |
| 6,617,260 | B2 | 9/2003 | Abe et al. |
| 2002/0140043 | A1 | 10/2002 | Mitani et al. |

FOREIGN PATENT DOCUMENTS

| | | |
|---|---|---|
| JP | 08-507175 | 7/1996 |
| JP | 10-012609 | 1/1998 |
| JP | 10-074835 | 3/1998 |
| JP | 10-261679 | 9/1998 |
| JP | 2002-118167 | 4/2002 |
| JP | 2002-299612 A | 10/2002 |
| WO | 94-019829 | 9/1994 |

OTHER PUBLICATIONS

Yuda K et al: "Controlling the Amount of SI-OH Bonds for the Formation of High-Quality Low-Temperature Gate Oxides for Poly-SI TFTS," NEC Research and Development, Nippon Electric Ltd. Tokyo, JP, vol. 40, No. 4, Oct. 1999, pp. 441-445, XP000940320 ISSN: 0547-051X.

Mitani Y et al:t al, 'Highly reliable gate oxide under fowler-nordheim electron injection by deuterium pyrogenic oxidation and denterated poly-Si deposition, Electron Devices Meeting, 2000, IEDM Technical Digest. International Dec. 10-13, 2000, Piscataway, NJ, USA, IEEE, Dec. 10, 2000, pp. 343-346, XP010531777, ISBN:0-7803-6438-4.

Izumi A et al: "Application of decomposed species generated by a heated catalyzer to ULSI fabrication processes," Preparation and Characterization, Elsevier Sequoia, NL, vol. 430, No. 1-2, Apr. 22, 2003, pp. 265-269, XP004427567, ISSN: 0040-6090.

Rivera A et al: "Interaction of deuterium with SIMOX buried oxide," Microelectronic Engineering, Elsevier Publishers BV., Amsterdam, NL, vol. 59, No. 1-4, Nov. 2001, pp. 497-501, XP004310684, ISSN: 0167-9317.

\* cited by examiner

METHOD OF EVALUATING CHARACTERISTICS OF AND FORMING OF AN INSULATING FILM FOR A SEMICONDUCTOR DEVICE

TECHNICAL FIELD

The present invention relates to a method of evaluating characteristics of an insulating film, a method of forming an insulating film used for a semiconductor device, a semiconductor device, an electronic device and an electronic apparatus.

BACKGROUND ART

Recently, in devices including semiconductor integrated circuits, in order to improve high integration thereof, the size of each element tends to become miniaturization increasingly. In a Metal Oxide Semiconductor Field Effect Transistor (MOSFET), for example, the thickness of a gate insulating film (gate insulator) becomes less than 10 nm, and therefore it is difficult to ensure resistance to a dielectric breakdown of the insulating film.

The dielectric breakdown of a gate insulating film includes a Time Zero Dielectric Breakdown (TZDB) and a time-dependent dielectric breakdown (TDDB). The TZDB is an initial failure of the gate insulating film, and means a dielectric breakdown in which a large leakage current flows in the insulating film at the moment of applying an electric stress such as a voltage stress, a current stress or the like. For this reason, The TZDB resistance can be evaluated by means of the measured value of a leakage current.

On the other hand, the TDDB is a phenomenon in which a dielectric breakdown occurs in the gate insulating film when some time has passed since the application of an electric stress, not at the time point when the electric stress is applied to the gate insulating film. For this reason the TDDB resistance can be evaluated by means of the integration value (Qbd value) of a leakage current flowing until a dielectric breakdown occurs.

Further, the TDDB is classified into a hard breakdown (HBD) and a soft breakdown (SBD). The HBD is a well-known dielectric breakdown, and a large leakage current flows in an insulating film after breakdown.

On the other hand, the SBD is a state at which a leakage current flows more than at an initial insulating state, but less than at the time after the HBD occurs.

The HBD is a dielectric breakdown that occurs when a relatively high electric stress is applied to an insulating film. Once a leakage current flows when the HBD occurs, an insulating property thereof is never recovered even though the insulating film is left without application of an electric stress thereto thereafter. On the other hand, the SBD is a dielectric breakdown that often occurs when a low electric stress is applied thereto. There is a case in which an insulating property thereof is recovered if the insulating film is left without application of an electric stress thereto after a leakage current occurred. Therefore, a MOSFET in which a SBD occurs may function as a semiconductor device (semiconductor element) although an insulating property thereof becomes unstable. Further, there is a possibility that the SBD shifts to the HBD as time goes by.

In addition, there is a low electric field leakage current referred to as a stress-induced leakage current (SILC) as deterioration after application of the electric stress. The SILC attracts attention as a precursor of the TDDB in addition to its effect on an insulating film to increase a leakage current. In this regard, each of the SILC and SBD still has many unclear points even though various examinations have been carried out. The SBD is also referred to as "B-mode SILC", and thus the distinction between the SILC and the SBD is unclear.

In these deterioration modes of the insulating film, the SBD and SILC particularly become problems in thinning a gate insulating film. In the case where the thickness of the gate insulating film (gate oxidized film) is 10 nm or less, the deterioration frequently occurs in the low electric field intensity range of 10 MV/cm or less (that is, in the low voltage range in which the electric field intensity is in the range of 10 MV/cm or less), and this becomes major cause that prevent a gate insulating film from being thinned.

For example, Japanese Laid-Open Patent Application No. 2002-299612 discloses an insulating film (gate insulating film) of a semiconductor device in which density of hydrogen atoms is reduced to a predetermined value in order to prevent the occurrence of the SILC. However, the above-mentioned patent application focuses on prevention of occurrence of the SILC, and as a result, the occurrence of the SBD is not examined and discussed in this application.

Therefore, in the present circumstances, a method of evaluating a gate insulating film that aims at preventing the SBD from occurring has not examined yet.

In this regard, each of hydrogen atoms in the insulating film exists at a state of molecular hydrogen or at a connected state to any one of constituent elements of the insulating film. However, this patent application only defines the total amount of hydrogen atoms. According to consideration of the present inventor, it is understood that it is difficult to prevent the occurrence of SBD only by reducing the total amount of hydrogen atoms in the insulating film.

DISCLOSURE OF INVENTION

It is therefore one object of the present invention to provide a method of evaluating an insulating film with which the evaluation of the insulating film can be carried out with high reliability wherein the insulating film can prevent SBD or SILC from occurring even in the case of thinning the insulating film and have high resistance to a dielectric breakdown such as SILC, TZDB, or TDDB (that is, that can improve insulating properties to SILC, TZDB, or TDDB).

Further, it is another object of the present invention to provide a high reliable insulating film that has been evaluated by means of the evaluation method mentioned above, a semiconductor device including such an insulating film, an electronic device and an electronic apparatus that include the above-mentioned semiconductor device.

In order to achieve the above object, in one aspect of the present invention, the present invention is directed to a method of evaluating characteristics of an insulating film. The insulating film is formed of an insulative inorganic material as a main material. The insulative inorganic material contains silicon and oxygen, and the insulating film contains hydrogen atoms. The method of the present invention includes the steps of:

analyzing the insulating film to which an electric field has never been applied by Thermal Desorption Spectroscopy;

comparing intensity of an $H_2$ fragment with intensity of an OH fragment, the intensity of the $H_2$ fragment and the intensity of the OH fragment being measured at a state where the insulating film is heated at a temperature in the range of 500 to 1000° C.; and evaluating the characteristics of the insulating film on the basis of the comparison result.

This makes it possible to evaluate an insulating film having high resistance to a dielectric breakdown such as SILC, TZDB, or TDDB with high accuracy even in the case of thinning the insulating film.

In the method of evaluating characteristics of the insulating film (evaluation method) of the present invention, it is preferable that the evaluating step includes the step of estimating one or more characteristic value of the insulating film that correlates with the comparison result wherein the characteristics of the insulating film are evaluated on the basis of the one or more estimated characteristic value.

According to the evaluation method of the present invention, it is possible to evaluate the characteristics of the insulating film with high accuracy without evaluating the characteristics of the insulating film directly (that is, nondestructive inspection), and it is possible to reduce manufacturing costs thereof.

In the evaluation method of the present invention, it is preferable that the one or more estimated characteristic value includes the value of a leakage current to be measured when an electric field is applied to the insulating film and the integration value (hereinafter, referred to as "Qbd value") of the leakage current that would have flowed through the insulating film until a dielectric breakdown occurs therein, wherein the characteristics of the insulating film to be evaluated includes resistance to a dielectric breakdown of the insulating film.

By estimating the leakage current value and/or the Qbd value, it is possible to evaluate resistance to a dielectric breakdown of the insulating film.

In the evaluation method of the present invention, it is preferable that in the comparing step the comparison result is obtained using the ratio ($[OH]/[H_2]$) of the intensity of the $H_2$ fragment $[H_2]$ and the intensity of the OH fragment $[OH]$ at a predetermined temperature within the range of 500 to 1000° C. or the integration value ($\Sigma([OH]/[H_2])$) of the ratio ($[OH]/[H_2]$) as an index, and in the evaluating step the characteristics of the insulating film is evaluated on the basis of the comparison result.

This makes it possible to estimate the characteristic value of the insulating film (that is, the leakage current value and/or the Qbd value), and as a result, it is possible to evaluate the characteristics of the insulating film (including the resistance to a dielectric breakdown) surely.

In the evaluation method of the present invention, it is preferable that in the evaluating step the insulating film is evaluated to have an acceptable quality in the case where the ratio ($[OH]/[H_2]$) or the integration value ($\Sigma([OH]/[H_2])$) of the ratio ($[OH]/[H_2]$) of the insulating film is smaller than a predetermined threshold.

This makes it possible to determine the insulating film having excellent characteristics of the insulating film (for example, excellent resistance to a dielectric breakdown) as an acceptable product surely, and it is possible to carry out a quality inspection of the insulating film with high accuracy.

In the evaluation method of the present invention, it is preferable that in the insulating film each hydrogen atom in at least a part of the hydrogen atoms is replaced with a deuterium atom D.

In this case, it is preferable that the $H_2$ fragment $[H_2]$ of which the hydrogen atoms are respectively replaced with the deuterium atoms is defined as a $D_2$ fragment $[D_2]$ and the OH fragment of which the hydrogen atom is replaced with the deuterium atom is defined as a OD fragment $[OD]$, wherein in the comparing step the comparison result is obtained using the ratio ($[OD]/[D_2]$) of the intensity of the $D_2$ fragment $[D_2]$ and the intensity of the OD fragment $[OD]$ at a predetermined temperature within the range of 500 to 1000° C. or the integration value ($\Sigma([OD]/[D_2])$) of the ratio ($[OD]/[D_2]$) as an index, and in the evaluating step the characteristics of the insulating film is evaluated on the basis of the comparison result.

This makes it possible to evaluate the characteristics of the insulating film (in particular, SBD) in which each hydrogen atom in at least a part of the hydrogen atoms is replaced with a deuterium atom D.

In the evaluation method of the present invention, it is preferable that the insulative inorganic material further includes at least one of nitrogen, hafnium, zirconium and aluminum in addition to silicon and oxygen.

According to the evaluation method of the present invention, it is possible to evaluate the characteristics of the insulating film surely even in the case of an insulating film having such an insulative inorganic material.

In the evaluation method of the present invention, it is preferable that the average thickness of the insulating film is 10 nm or less.

It is particularly effective to apply the evaluation method of the present invention to such a thin insulating film.

In the evaluation method of the present invention, it is preferable that the insulating film is adapted to be used under the condition that a voltage is applied to the insulating film in the thickness direction thereof so that the electric field intensity in the insulating film is 10 MV/cm or less.

It is particularly effective to apply the evaluation method of the present invention to the insulating film to be used for a gate insulating film, for example.

In another aspect of the present invention, the present invention is directed to a method of forming an insulating film used for a semiconductor device. The method in one embodiment of the present invention includes the steps of:

setting conditions of forming the insulating film on the basis of the evaluation result obtained by means of the evaluation method defined as described above; and forming the insulating film under the conditions.

A method of forming an insulating film used for a semiconductor device in another embodiment of the present invention includes the steps of:

setting conditions of forming the insulating film on the basis of the evaluation result obtained by means of the evaluation method defined as described above, wherein the conditions are set so that the ratio ($[OH]/[H_2]$) or the integration value ($\Sigma([OH]/[H_2])$) of the ratio ($[OH]/[H_2]$) of the evaluated insulating film becomes smaller; and forming the insulating film under the conditions.

In this case, in the forming method of the present invention, it is preferable that in the setting step the conditions are set on the basis of whether or not the ratio ($[OH]/[H_2]$) or the integration value ($\Sigma([OH]/[H_2])$) of the ratio ($[OH]/[H_2]$) of the evaluated insulating film is smaller than a predetermined threshold.

In the forming method of the present invention, it is preferable that the conditions include whether or not the insulating film is subjected to heat treatment, and conditions of the heat treatment in the case where the insulating film is subjected to the heat treatment.

In the insulating film of the present invention, it is preferable that a leakage current passing through the gate insulating film in the thickness direction thereof that is measured in a state that the gate voltage is applied to the gate electrode so that the electric field intensity in the insulating film is 5 MV/cm or less is $9 \times 10^{-9}$ A/cm$^2$ or less.

This makes it possible to further prevent a dielectric breakdown of the insulating film when the semiconductor device of the present invention is used.

In the insulating film of the present invention, it is preferable that the integration value of the leakage current passing through the insulating film in the thickness direction thereof until a soft breakdown occurs in the insulating film is 40 C/cm² or more.

This makes it possible to further prevent a dielectric breakdown of the gate insulating film when the semiconductor device of the present invention is used.

In the insulating film of the present invention, it is preferable that the integration value of the leakage current passing through the insulating film in the thickness direction thereof until a hard breakdown occurs in the insulating film is 100 C/cm² or more.

This makes it possible to further prevent a dielectric breakdown of the gate insulating film when the semiconductor device of the present invention is used.

Further, in another aspect of the present invention, the present invention is directed to a semiconductor device. The semiconductor device of the present invention includes the insulating film described above.

This makes it possible to obtain a semiconductor device having superior characteristics.

In still another aspect of the present invention, the present invention is directed to an electronic device. The electronic device of the present invention includes the semiconductor device described above.

This makes it possible to obtain an electronic device having high reliability.

Moreover, in yet another aspect of the present invention, the present invention is directed to an electronic apparatus.

The electronic apparatus of the present invention includes the electronic device described above.

This makes it possible to obtain an electronic apparatus having high reliability.

BRIEF DESCRIPTION OF DRAWINGS

The above and other objects, features, and the advantages of the invention will readily become more apparent from the following detailed description of preferred embodiments of the invention with reference to the accompanying drawings.

BEST MODE FOR CARRYING OUT THE INVENTION

Hereinafter, a method of evaluating an insulating film, an insulating film, a semiconductor device, an electronic device and an electronic apparatus of the present invention will now be described with respect to preferred embodiments thereof.

<Semiconductor Device>

First, a semiconductor device of the present invention will now be described.

Figure 1:
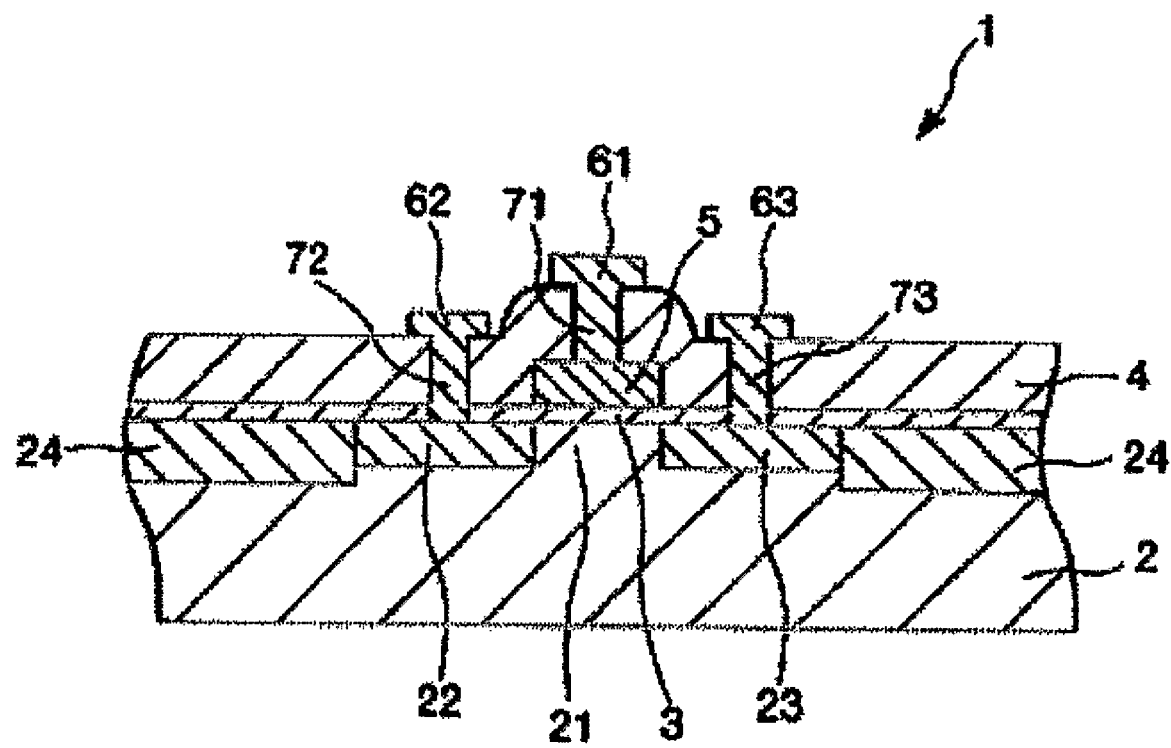
FIG. 1 is a longitudinal cross sectional view which shows a semiconductor device including an insulating film in one embodiment according to the present invention.
Figure 2:
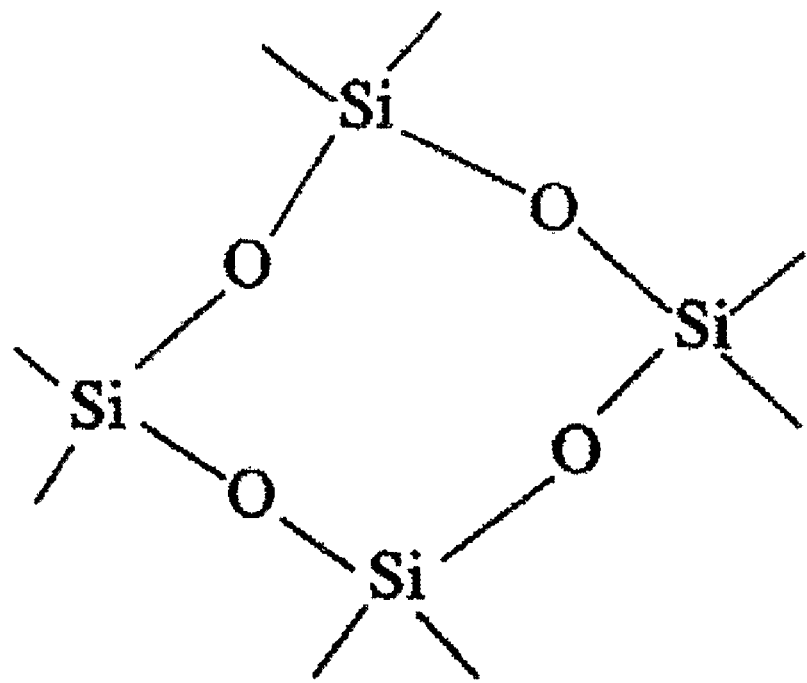
FIG. 2 is a schematic view which shows a molecular structure of the insulating film.
Figure 3:
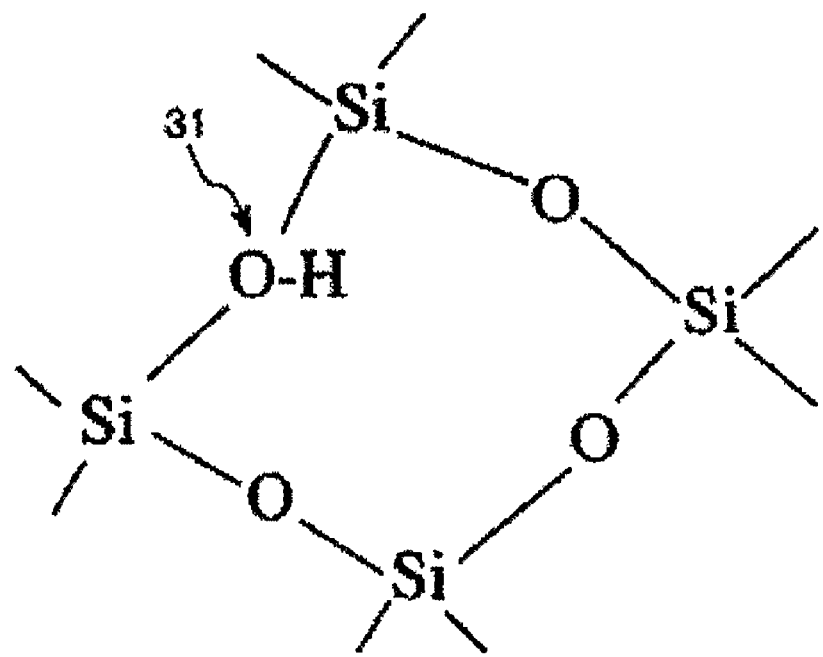
FIG. 3 is a schematic view which shows a molecular structure of the insulating film.

FIG. 1 is a longitudinal cross sectional view which shows a semiconductor device including a gate insulating film in one embodiment according to the present invention. FIGS. 2 and 3 are schematic views each of which shows a molecular structure of the insulating film. Now, in following explanations using FIG. 1, for convenience of explanation, an upper side and lower side in FIG. 1 are referred to as "upper" and "lower," respectively.

A semiconductor device 1 shown in FIG. 1 includes a semiconductor substrate 2, a gate insulating film 3 provided so as to cover the semiconductor substrate 2, and an interlayer insulating film 4. The semiconductor substrate 2 includes an element separate structure 24, a channel region 21, a source region 22, and a drain region 23. The semiconductor device 1 further includes a gate electrode 5 provided so as to face the channel region 21 via the gate insulating film 3, a conductive portion 61 provided on the interlayer insulating film 4 and above the gate electrode 5, a conductive portion 62 provided on the interlayer insulating film 4 and above the source region 22 and functioning as a source electrode, a conductive portion 63 provided on the interlayer insulating film 4 and above the drain region 23 and functioning as a drain electrode, a contact plug 71 which electrically connects the gate electrode 5 to the conductive portion 61, a contact plug 72 which electrically connects the source region 22 to the conductive portion 62, and a contact plug 73 which electrically connects the drain region 23 to the conductive portion 63.

The semiconductor substrate 2 is formed of a semiconducting material including, for example, silicon such as polycrystalline silicon, amorphous silicon, or the like, germanium, gallium arsenide. As described above, the semiconductor substrate 2 has the element separate structure 24, and the channel region 21, the source region 22, and the drain region 23 are provided in regions compartmented by the element separate structure 24. Further, in the semiconductor substrate 2, the source region 22 is formed at one side portion of the channel region 21, while the drain region 23 is formed at the other side portion of the channel region 21.

The element separate structure 24 is constructed so that an insulating material such as $SiO_2$ is embedded in a trench. This makes it possible to separate adjacent elements electrically, and therefore it is possible to prevent interference between adjacent elements. The channel region 21 is formed of an intrinsic semiconductor, for example. Each of the source region 22 and the drain region 23 are formed of a semiconductor material in which an intrinsic semiconductor is doped with an n-type impurity such as P⁺ (phosphorus ion), for example.

It should be noted that each of the channel region 21, the source region 22 and the drain region 23 is not limited thereto.

For example, each of the source region 22 and the drain region 23 may be constituted so as to be formed of a semiconducting material in which an intrinsic semiconductor is doped with a p-type impurity. Further, the channel region 21 may be constituted so as to be formed of a semiconducting material in which an intrinsic semiconductor is doped with a p-type or n-type impurity. Such a semiconductor substrate 2 is covered with an insulating film (that is, the gate insulating film 3 and the interlayer insulating film 4). The portion of the insulating film (the gate insulating film 3) that is sandwiched between the channel region 21 and the gate electrode 5 serves as a channel of an electric field generated between the channel region 21 and the gate electrode 5.

A method of evaluating an insulating film of the present invention is applied to the evaluation of this gate insulating film 3. This point (evaluation method) will be described later in detail.

The constituent material of the interlayer insulating film 4 is not particularly limited, and for example, silicon system compound such as $SiO_2$, TEOS (ethyl silicate), poly-silazane can be used as the constituent material of the interlayer insulating film 4. In addition, the interlayer insulating film 4 can be formed of any one of various resin materials, various ceramics materials and the like, for example. The conductive potions 61, 62 and 63 are provided on the interlayer insulating film 4. As described above, the conductive portion 61 is formed above the channel region 21, and the conductive portions 62, 63 are formed above the source region 22 and the drain region 23, respectively.

Further, in the gate insulating film 3 and the interlayer insulating film 4, a hole portion (contact hole) communicated to the gate electrode 5, a hole portion communicated to the source region 21, and a hole portion communicated to the drain region 23 are formed in the region where the channel region 21, the source region 22, and the drain region 23 are formed, respectively. The contact plugs 71, 72 and 73 are provided in these hole portions, respectively.

The conductive portion 61 is connected to the gate electrode 5 via the contact plug 71. The conductive portion 62 is connected to the source region 22 via the contact plug 72. The conductive portion 63 is connected to the drain region 23 via the contact plug 73.

Next, a structure of the gate insulating film 3 and the method of evaluating this gate insulating film 3 will now be described. In the present invention, the gate insulating film 3 to be evaluated is formed of an insulative inorganic material containing silicon and oxygen as a main material. The gate insulating film 3 further contains hydrogen atoms.

Hereinafter, the case where the gate insulating film 3 is constructed from a $SiO_2$ film that is made from silicon oxide ($SiO_Z$, $0<Z\leq2$: that is, SiO and $SiO_2$) as a main material will be specifically described as one example of the structure of the gate insulating film 3 and the method of evaluating this gate insulating film 3.

More specifically, as shown in FIG. 2, the $SiO_2$ film is constructed from substantially complete three-dimension network of Si—O bonding formed by coordinating one silicon atom with four oxygen atoms as well as by coordinating one oxygen atom with two silicon atoms. The $SiO_2$ film is in an amorphous state at which the directionality of bonding becomes disorganized. When the $SiO_2$ film is formed by means of a thermal oxidation method, a CVD (Chemical Vapor Deposition) method or the like as described later, hydrogen atoms inevitably come to be mixed in the inside of the $SiO_2$ film due to gases existing in the atmosphere which includes molecular hydrogen and hydrogen atom.

Then, hydrogen atoms exist in the inside of the $SiO_2$ film as molecular hydrogen ($H_2$). In this case, any of the hydrogen atoms respectively react with Si—O bonding structures to form the Si—OH structure and the Si—H structure (that is, to intrude into the $SiO_2$ film), and as a result, they have an impact on an electronic structure (electronic state) of the gate insulating film 3.

The inventor of the present invention found that a Si—OH structure 31 in which one oxygen atom is coordinated with three other atoms (which are two Si atoms and one H atom in FIG. 3) by means of first principle electronic structure simulation, and that an excess electron contributes a current that flows in an insulating film, namely, that the more the Si—OH structures 31 exist in the insulating film, the more a leakage current flows over the gate insulating film 3 (that is, the TZDB tends to occur).

Further, the inventor found that the Si—OH structures 31 in each of which one oxygen atom is coordinated with three other atoms are susceptible to an outer electric field and stabilized by an electric field to be increased, and as a result a leakage current due to an electric stress (that is, SILC) may be increased, by which a generation mechanism of the SBD can be explained. Then, the inventor found that the HBD tends to occur as these results (that is, the TDDB tends to occur).

Moreover, the inventor found that the amount of the Si—OH structures 31 in each of which one oxygen atom is coordinated with three other atoms increase in accordance with the intensity of an electric stress and the time to undergo the electric stress, and that the more superior resistance to a dielectric breakdown an obtained insulating film has, the less the amount of Si—OH structures 31 that the gate insulating film 3 has before the gate insulating film 3 undergoes such an electric stress is. In other words, the insulating film wherein the absolute quantity of the Si—OH structures 31 in each of which one oxygen atom is coordinated with three other atoms is small in unit volume of the $SiO_2$ film to which an electric field has never been applied has high reliability (characteristic).

Thus, if the absolute quantity of the Si—OH structures 31 can be measured, it is possible to carry out the evaluation of the gate insulating film 3. The inventor attempted to use Thermal Desorption Spectroscopy Method (TDS method) as a method of measuring the absolute quantity of the Si—OH structures 31 in the $SiO_2$ film.

In this regard, the TDS method is a method of detecting fragments (gases) such as $H_2$, $H_2O$, OH, and $CO_2$ that are desorbed from a sample by heating the sample. In the case where molecular weight of the fragment and the charge state thereof are respectively defined as M and z, the intensity of the obtained fragment is detected as M/z with a mass spectrometer.

As a result of analysis of the $SiO_2$ film using the TDS method, it become clear that the molecules adsorbed on the surface of the $SiO_2$ film start to desorb at the temperature in the range of 100 to 200° C. and almost all the molecules desorb until 500° C. Therefore, it is assumed that the fragments such as $H_2$ and OH detected at the temperature of 500° C. or more are derived from $H_2$ and OH existing in the $SiO_2$ film. It is thought that it is possible to quantitate the absolute quantity of the Si—OH structures 31 by measuring the intensity of the OH fragment at the temperature of 500° C. or more. However, it is impossible to quantitate the absolute quantity of the Si—OH structures 31 on the basis of the intensity of the OH fragment because of reasons A to C as follows.

Reason A: It is impossible to prepare a standard sample in which the amount of Si—OH structures 31 in the $SiO_2$ film is known. For this reason, it is impossible to create an analytical curve thereof. Therefore, it is impossible to obtain the absolute quantity of the Si—OH structures 31 accurately on the basis of the measured intensity of OH fragment.

Reason B: A part of OH fragments derived from the Si—OH structures 31 in the $SiO_2$ film is changed into $H_2O$ molecule or $O_2$ molecule after desorption. On the other hand, $H_2O$ molecules included in the $SiO_2$ film are changed into OH fragments by ionization. Therefore, it is difficult to determine from what the desorbed OH fragments (that is, detected OH fragments) are derived.

Reason C: Even though the intension of the OH fragment derived from the Si—OH structure can be extracted from the measured intension of the OH fragment, S/N (signal-to-noise) ratio becomes worse because the $H_2O$ molecules included in the $SiO_2$ film mentioned in the Reason B affect the measured intension of the OH fragment.

Then, the inventor of the present invention further persevered in examination and found that the ratio ($[OH]/[H_2]$) of the intensity of the $H_2$ fragment $[H_2]$ and the intensity of the OH fragment [OH] measured at a state where the insulating film is heated at temperature of 500° C. or more correlates with the characteristics of the gate insulating film ($SiO_2$ film) 3 (in particular, SBD).

It is estimated that this is due to reasons as follows.

It is thought that $H_2$ molecules included in the $SiO_2$ film normally exist in a space surrounded by a network of Si—O bonding like a basket and diffuse in such a space at a high speed. As described above, a part of $H_2$ molecules react with Si—O bonding structures in any places of the $SiO_2$ film to form Si—OH structures 31. It is known that the probability of occurrence of this reaction strongly depends on the network structure of Si—O bonding. Then, it is thought that $H_2$ molecules are in equilibrium with Si—OH structures 31. As described above, the amount of Si—OH structures 31 at the equilibrium state increases or decreases in accordance with difference of the network structure of the Si—O bonding, and accordingly the amount of molecular hydrogen ($H_2$) becomes smaller or larger.

For this reason, the ratio ($[OH]/[H_2]$) of the intensity of the $H_2$ fragment $[H_2]$ and the intensity of the OH fragment [OH] indicates a large value in the case where the amount of Si—OH structures 31 in the $SiO_2$ film is relatively large, while the ratio indicates a small value in the case where the amount of Si—OH structures 31 in the $SiO_2$ film is relatively small. Thus, it is possible to make the quantitative relation of Si—OH structures 31 clearer. By using the value of such a ratio, it is possible to reduce noise due to $H_2O$ molecules or the like included in the $SiO_2$ film and increase measurement sensitivity thereof.

For the two reason described above, it is possible to evaluate the characteristics of the gate insulating film 3 using the ratio ($[OH]/[H_2]$) of the intensity of the $H_2$ fragment $[H_2]$ and the intensity of the OH fragment [OH].

In this regard, the correlation between this ratio and the characteristics of the gate insulating film 3 is confirmed at temperature of 500° C. or more. The upper limit of such temperature is not particularly limited. Because the SiO2 film changes in quality and deteriorates at temperature of 1000° C. or more, it is preferable that the measuring range of heating temperature is in the range of 500 to 1000° C.

The evaluation method of the present invention is made on the basis of such information described above. The evaluation method includes the steps of: analyzing the gate insulating film ($SiO_2$ film) 3 by Thermal Desorption Spectroscopy; comparing the intensity of an $H_2$ fragment with the intensity of an OH fragment measured at a state where the gate insulating film 3 is heated at a temperature in the range of 500 to 1000° C.; and evaluating the characteristics of the insulating film on the basis of the comparison result. It is preferable that the temperature to compare the intensity of $H_2$ fragment with the intensity of OH fragment is in the range that the influence on the noise due to the Reason B described above, and more specifically it is preferable that the temperature is in the range of 700 to 900° C.

In this regard, in order to evaluate resistance to a dielectric breakdown of an insulating film, a large numbers of tests must be repeated to obtain statistical data and it takes long time and the cost for carrying out the tests is increased. Further, of course, the gate insulating film 3 after test cannot be utilized as a product because insulation of the insulating film is destroyed.

However, in the evaluation method of the present invention, the characteristic value of the $SiO_2$ film that correlates with the comparison result of the intensity of the $H_2$ fragment $[H_2]$ with the intensity of the OH fragment [OH] is estimated, and the characteristics of the $SiO_2$ film are evaluated on the basis of the estimated characteristic value. According to such an evaluation method, it is possible to evaluate the gate insulating film ($SiO_2$ film) 3 with high accuracy, a simple method and a low cost without evaluating the characteristics of the $SiO_2$ film directly (that is, nondestructive inspection).

Because the heating temperature in the range of 700 to 900° C. have little influence on the gate insulating film 3, it is possible to use the gate insulating film 3 to which the evaluation method has been applied. Thus, the evaluation method is provided with a desirable feature as an inspection method if the evaluation method is applied to a forming process of the gate insulating film 3.

In this regard, when the absolute quantity of the Si—OH structures 31 is evaluated using the evaluation method, the gate insulating film 3 to be measured must be one to which an electric field has never been applied (that is, the gate insulating film 3 receives no electric stress), and upon measuring threshold values are specified to values when measuring the intensity of $H_2$ fragment and the intensity of OH fragment on the conditions at which the gate insulating film 3 receives no stress. These points are most important to make the relation to experimental results (that is, the intensity of $H_2$ fragment and the intensity of OH fragment) clear.

The characteristic value to be estimated is not particularly limited. It is preferable to use the value of a leakage current and/or the Qbd value (that is, the integration value of the leakage current that would have flowed through the insulating film until a dielectric breakdown occurs therein) of the gate insulating film 3. This makes it possible to evaluate resistance to a dielectric breakdown of the $SiO_2$ film (gate insulating film 3) surely.

In addition to the ratio ($[OH]/[H_2]$) described above, for example, a different value, a value obtained from the combination of the ratio and the different value, or the like can be used as an index when comparing the intensity of the $H_2$ fragment with the intensity of the OH fragment measured at a state where the gate insulating film 3 is heated at a temperature in the range of 500 to 1000° C. However, it is preferable that the ratio ($[OH]/[H_2]$) or the integration value ($\Sigma([OH]/[H_2])$) of the ratio ($[OH]/[H_2]$) is used as an index. By obtaining the comparison result using such an index, it is possible to make the quantitative relation of the Si—OH structures 31 clearer, and to reduce the noise due to molecules other than the Si—OH structures 31 included in the $SiO_2$ film. As a result, it is possible to estimate the characteristic value (that is, the value of a leakage current and/or the Qbd value) on the basis of the comparison result, and this makes it possible to evaluate the characteristics of the $SiO_2$ film including resistance to a dielectric breakdown surely. Therefore, the gate insulating film 3 from which acceptable evaluation result is obtained has high resistance to a dielectric breakdown.

In this regard, whether or not the ratio or the integration value of the ratio is used as an index may be suitably selected in accordance with the kind of evaluated object. Various evaluation methods may be mentioned as an industrial applicable method of evaluating a gate insulating film 3 using such an index. For example, the evaluation method can be used in (1) the case of setting conditions when forming the gate insulating film 3, (2) the case of determining whether or not a predetermined condition is added to the forming conditions, and (3) the case of evaluating the quality of the formed gate insulating film 3.

Hereinafter, the cases (1) to (3) will be described in turn.

(1) the case of setting conditions when forming the gate insulating film 3

The conditions of forming the gate insulating film 3 are set so that the ratio ($[OH]/[H_2]$) or the integration value ($\Sigma([OH]/[H_2])$) of the ratio ($[OH]/[H_2]$) of the evaluated insulating film becomes smaller. This makes it possible to set the conditions such as conditions of heat treatment and the order of steps of the method of forming the $SiO_2$ film to suitable values and suitable order. As a result, it is possible to improve the resistance to a dielectric breakdown of the $SiO_2$ film, and this makes it possible to prevent a dielectric breakdown from occurring.

(2) the case of determining whether or not a predetermined condition is added to the forming conditions In the case where the ratio ($[OH]/[H_2]$) or the integration value ($\Sigma([OH]/[H_2])$) of the ratio ($[OH]/[H_2]$) of the evaluated $SiO_2$ film becomes smaller than a predetermined threshold when forming the $SiO_2$ film by applying a predetermined condition thereto, the predetermined condition is added to the conditions of forming subsequent $SiO_2$ film. This makes it possible to accurately determine whether or not a predetermined condition such as heat treatment is added to the conditions of forming the $SiO_2$ film. As a result, it is possible to prevent a useless condition from being added to the forming conditions surely, and this makes it possible to reduce a manufacturing time and manufacturing costs of the $SiO_2$ film.

(3) the case of evaluating the quality of the formed gate insulating film 3

In the case where the ratio ($[OH]/[H_2]$) or the integration value ($\Sigma([OH]/[H_2])$) of the ratio ($[OH]/[H_2]$) of the evaluated $SiO_2$ film becomes smaller than a predetermined threshold, the $SiO_2$ film is evaluated to have an acceptable quality. This makes it possible to determine the $SiO_2$ film having excellent resistance to a dielectric breakdown as an acceptable product surely, and to carry out a quality inspection of the gate insulating film 3 with high accuracy. Further, in the case where the $SiO_2$ film evaluated as an acceptable product by such an evaluation method is applied to a gate insulating film 3 of a semiconductor device 1, it is possible to obtain the semiconductor device 1 having stable characteristics and durability.

The constituent material (insulative inorganic material) of the gate insulating film 3 is not limited to one formed from silicon oxide ($SiO_Z$, $0<Z\leq2$: that is, SiO and $SiO_2$) as described above as a main material, and the gate insulating film 3 may contain other element (atoms of other element) other than silicon and oxygen. It is preferable that the other element includes at least one of nitrogen, hafnium, zirconium, and aluminum. By containing nitrogen atoms, it is possible to improve compactness of the gate insulating film 3, for example. Further, by containing nitrogen, hafnium, zirconium, or aluminum, it is possible to improve the stability of the gate insulating film 3 and dielectric constant of the gate insulating film 3, for example.

The method of evaluating an insulating film of the present invention includes the steps of comparing the intension of the H2 fragment with the intension of OH fragment; and evaluating the characteristics of the gate insulating film 3. Therefore, it is possible to surely evaluate the characteristics of a gate insulating film 3 that contains other element or elements other than silicon and oxygen without the influence of such other elements.

Further, each hydrogen atom in at least a part of the hydrogen atoms in the gate insulating film 3 may be replaced with deuterium atom (D). This makes it possible to further reduce instable structures to an outer electric field (the structures in which a hydrogen atom is bonded to the element other than silicon in the constituent elements of the insulative inorganic material). As a result, it is possible to improve resistance to a dielectric breakdown of the gate insulating film 3.

In the case where each hydrogen atom in at least a part of the hydrogen atoms in the gate insulating film 3 is replaced with a deuterium atom D, it is possible to further improve the resistance to a dielectric breakdown of such a gate insulating film 3 as long as the absolute quantity of Si—OD structures in the gate insulating film 3 is reduced. Such a gate insulating film 3 may be evaluated by comparing the intensity of an $H_2$ fragment with the intensity of an OH fragment as described above. However, it is preferable to evaluate such a gate insulating film 3 in consideration of intensity of a $D_2$ fragment with intensity of an OD fragment.

More specifically, in consideration of the $D_2$ fragment $[D_2]$ and the OD fragment [OD] at a predetermined temperature within the range of 500 to 1000° C., for example, the ratio $[OD]/[D_2]$, $[OH]/[D_2]$ and $[OD]/[H_2]$ and the integration value of these ratios may be mentioned as an index. Among these, it is preferable that the ratio ($[OD]/[D_2]$) of the intensity of the $D_2$ fragment $[D_2]$ and the intensity of the OD fragment [OD] or the integration value ($\Sigma([OD]/[D_2])$) of the ratio ($[OD]/[D_2]$) is used as an index. This makes it possible to evaluate the characteristics of the gate insulating film ($SiO_2$ film) 3 (in particular, SBD) in which each hydrogen atom in at least a part of the hydrogen atoms in the gate insulating film 3 is replaced with a deuterium atom D more surely.

The method of forming the gate insulating film 3 as described above will be described in the explanation of a method of manufacturing the semiconductor device 1.

It is preferable that the average thickness of the gate insulating film 3 (the average film thickness) is 10 nm or less, and more preferably it is in the range of about 1 to 7 nm. By restricting the thickness of the gate insulating film 3 within the above range, it is possible to make the semiconductor device 1 smaller sufficiently.

Further, the SILC or SBD tends to occur frequently in particular when the thickness of the gate insulating film 3 is made thinner as the range described above. Thus, it is particularly effective that the evaluation method of the present invention is applied to the gate insulating film 3 having such a thinner film thickness.

Further, it is preferable that the semiconductor device 1 is adapted to be used under the condition that a gate voltage is applied to the gate electrode 5 so that the electric field intensity in the gate insulating film 3 is 10 MV/cm or less. More preferably the electric field intensity in applied the gate insulating film 3 is 5 MV/cm or less. The SILC or SBD is a defect that it tends to occur when a gate voltage is applied to the gate electrode 5 so that the electric field intensity therein is within the limit described above. It is particularly effective that the evaluation method of the present invention is applied to the gate insulating film 3 that is to be used at such a state.

In this regard, there is a fear that an irreversible dielectric breakdown (that is, HBD) occurs when a higher gate voltage is applied to the gate electrode 5 so that the electric field intensity is over the upper limit described above.

Moreover, it is preferable that in the gate insulating film 3 evaluated by means of the evaluation method of the present invention the value of a leakage current passing through the gate insulating film 3 in the thickness direction thereof that is measured in a state where the gate voltage is applied to the gate electrode 5 so that the electric field intensity in the insulating film is 5 MV/cm or less is $9 \times 10^{-9}$ A/cm$^2$ or less. More preferably the value of the leakage current is $5 \times 10^{-9}$ A/cm$^2$ or less. By satisfying such a condition in the gate insulating film 3, it is difficult for a dielectric breakdown of the gate insulating film 3 to occur when the semiconductor device 1 is used.

In this regard, in the case where the time point at which a small voltage change is initially generated is the SBD (soft breakdown) by supplying a constant current to the gate insulating film 3, it is preferable that in the gate insulating film 3 evaluated by means of the evaluation method of the present invention the total amount of electric charges passing through the gate insulating film 3 in the thickness direction thereof until a soft breakdown (SBD) occurs in the gate insulating film 3 is 40 C/cm$^2$ or more. More preferably the total amount of the electric charges is 75 C/cm$^2$ or more. By satisfying such a condition in the gate insulating film 3, it is difficult for a dielectric breakdown of the gate insulating film 3 to occur when the semiconductor device 1 is used.

Further, in the case where the time point at which a drastic voltage change is generated is the HBD (hard breakdown), it is preferable that in the gate insulating film 3 evaluated by means of the evaluation method of the present invention the total amount of electric charges passing through the gate insulating film 3 in the thickness direction thereof until a hard breakdown (HBD) occurs in gate the insulating film 3 is 100 C/cm$^2$ or more. More preferably the total amount of electric charges is 200 C/cm$^2$ or more. By satisfying such a condition in the gate insulating film 3, it is difficult for a dielectric breakdown of the gate insulating film 3 to occur when the semiconductor device 1 is used.

The case where the evaluation method of the present invention is applied to the gate insulating film 3 that the semiconductor device 1 includes has been described on the basis of preferred embodiment shown in FIGS. 1-3, but the evaluation method of the present invention can be applied to the interlayer insulating film 4 in the semiconductor device 1.

<Method of Manufacturing Semiconductor Device>

Next, a method of manufacturing the semiconductor device shown in FIG. 1 will now be described. FIG. 4A-4H are longitudinal cross sectional views for explaining a method of manufacturing the semiconductor device shown in FIG. 1. Now, in following explanations using FIGS. 4A-4H, for convenience of explanation, an upper side and lower side in FIGS. 4A-4H are referred to as "upper" and "lower," respectively.

Figure 4A:
FIGS. 4A-4H are longitudinal cross sectional views for explaining a method of manufacturing the semiconductor device shown in FIG. 1.

<1> As shown in FIG. 4A, a trench element separate structure 24 is formed on the surface of a semiconductor substrate 2 by means of Local Oxidation of Silicon (LOCOS) method or the like. Thus, element forming regions are compartmented on the surface of the semiconductor substrate 2.

<2> Next, a well is formed by carrying out ion doping onto the semiconductor substrate 2. For example, in the case of forming a p-well, p-type impurities such as B$^+$ ions or the like are doped into the semiconductor substrate 2, while in the case of forming an n-well, n-type impurities such as P$^+$ ions or the like are doped into the semiconductor substrate 2.

Figure 4B:
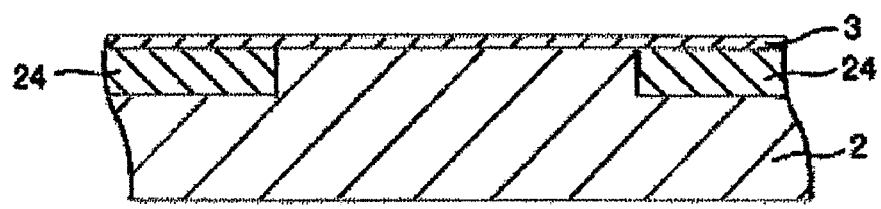

<3> Next, as shown in FIG. 4B, a gate insulating film 3 is formed on the semiconductor substrate 2. In this case, a method of forming the gate insulating film 3 includes the steps of: setting conditions of forming the gate insulating film 3 on the basis of the evaluation result obtained by means of the evaluation method described above; and forming the gate insulating film 3 under the conditions. Namely, the conditions are set so that the ratio ([OH]/[H$_2$]) or the integration value ($\Sigma$([OH]/[H$_2$])) of the ratio ([OH]/[H$_2$]) of the evaluated gate insulating film 3 becomes smaller. Alternatively, the conditions are set on the basis of whether or not the ratio ([OH]/[H$_2$]) or the integration value ($\Sigma$([OH]/[H$_2$])) of the ratio ([OH]/[H$_2$]) of the evaluated gate insulating film 3 is smaller than a predetermined threshold. In this regard, the conditions include whether or not the gate insulating film 3 is subjected to heat treatment and conditions of the heat treatment in the case where the insulating film is subjected to the heat treatment.

I: Silicon Oxide Film

In the case where a silicon oxide (SiO$_2$) film is formed as a gate insulating film 3, a thermal oxidation method, a CVD (Chemical Vapor Deposition) method or the like can be utilized, for example.

I-1: Thermal Oxidation Method

The thermal oxidation method is a method of forming a silicon oxide film on the surface of the silicon substrate (the semiconductor substrate 2) by supplying a gas containing oxygen atoms onto the silicon substrate heated. It is preferable that the heating temperature is in the range of about 300 to 1,000° C., and more preferably it is in the range of about 500 to 800° C.

Since the heating time may be appropriately set according to the desired thickness of the silicon oxide film, the heating time is not particularly limited. For example, in the case where the heating temperature is set to be in the above range, it is preferable that the heating time is in the range of about 10 to 90 minutes, and more preferably it is in the range of about 20 to 60 minutes. Further, as the gas containing oxygen atoms, for example, molecule oxygen (pure oxygen), ozone, hydrogen peroxide, water vapor, nitrogen monoxide, nitrogen dioxide, dinitrogen oxide, or the like may be mentioned. One kind of these or combination of two or more kinds of these can be utilized as the gas containing oxygen atoms.

I-2: CVD Method

The CVD method is a method of forming a silicon oxide film on the surface of the silicon substrate (the semiconductor substrate 2) by introducing a gas containing precursors to silicon oxide and oxygen atoms in a chamber to which a constant pressure is applied and heating the silicon substrate (the semiconductor substrate 2). As the precursors to silicon oxide, dichlorosilane, hexachloro disilanete, trakis (hydrocarbyl-amino) silane, tris (hydrocarbyl-amino) silane, and the like may be mentioned. One kind of these or combination of two or more kinds of these can be utilized as the precursors to silicon oxide.

As the gas containing oxygen atoms, for example, molecule oxygen (pure oxygen), ozone, hydrogen peroxide, water vapor, nitrogen monoxide, nitrogen dioxide, dinitrogen oxide, or the like may be mentioned. One kind of these or combination of two or more kinds of these can be utilized as the gas containing oxygen atoms. Further, it is preferable that the heating temperature is in the range of about 300 to 1,000° C., and more preferably it is in the range of about 500 to 800° C.

Since the heating time may be appropriately set according to the desired thickness of the silicon oxide film, the heating time is not particularly limited. For example, in the case where the heating temperature is set to be in the above range, it is preferable that the heating time is in the range of about 10 to 90 minutes, and more preferably it is in the range of about 20 to 60 minutes. Moreover, it is preferable that the pressure (degree of vacuum) in the chamber is in the range of about 0.05 (6.67 Pa) to 760 Torr (that is, atmosphere pressure, $1.013 \times 10^5$ Pa), and more preferably it is in the range of about 0.1 (13.3 Pa) to 500 Torr ($6.67 \times 10^5$ Pa). Furthermore, it is preferable that a mixture ratio (mole ratio) of precursors to silicon oxide to a gas containing oxygen atoms is in the range of about 10:1 to 1:100, and more preferably it is in the range of about 1:2 to 1:10.

II: Silicon Oxynitride Film

In the case where a silicon oxynitride (SiON) film is formed as a gate insulating film 3, for example, the silicon oxynitride (SiON) film can be formed using a mixture gas of a gas containing oxygen atoms and a gas containing nitrogen atoms in place of a gas containing oxygen atoms in the CVD (Chemical Vapor Deposition) method described in I-2. As the gas containing nitrogen atoms, for example, ammonia, hydrazine, alkyl hydrazine compound, hydrogen azide, nitrogen monoxide, nitrogen dioxide, dinitrogen oxide, or the like may be mentioned. One kind of these or combination of two or more kinds of these can be utilized as the gas containing nitrogen atoms. In addition, the silicon oxynitride (SiON) film can be obtained by applying heat treatment to a silicon oxide film in the atmosphere including nitrogen gases ($N_2$), for example.

III: Hafnium Silicate Film, Zirconium Silicate Film, and Aluminum Silicate Film

In the case where a hafnium silicate (HfSiO) film, a zirconium silicate (ZrSiO) film, or an aluminum silicate (AlSiO) film is formed as a gate insulating film 3, a CVD (Chemical Vapor Deposition) method, a PVD method (Physical Vapor Deposition such as a vacuum evaporation method), a spattering method or the like can be utilized, for example.

Further, by mixing two or more compounds each constituting the insulating film as the gate insulating film 3 (that is, the silicon oxide film, silicon oxynitride film, hafnium silicate film, zirconium silicate film, and aluminum silicate film) and carrying out one method (herein, spattering method) or two or more methods described above, it is possible to form the gate insulating film 3 constituted from multiple compounds. Moreover, for example, heat treatment or the like may be applied to the obtained gate insulating film 3 in the atmosphere including water vapor ($H_2O$). In this case, it is preferable that the heating temperature is in the range of about 500 to 1,200° C., and more preferably it is in the range of about 700 to 1,000° C.

In the case where the heating temperature is set to be in the above range, it is preferable that the heating time is in the range of about 10 to 90 minutes, and more preferably it is in the range of about 20 to 60 minutes. Further, it is preferable that the relative humidity of the atmosphere is in the range of about 50 to 100% RH, and more preferably it is in the range of about 75 to 100% RH. By forming the gate insulating film 3 with the method and conditions described above, it is possible to prevent interfusion of hydrogen atoms. This makes it possible to reduce the existing amount of Si—OH structures in the gate insulating film, and as a result, it is possible to form a gate insulating film 3 that can endure the evaluation method of the present invention.

In this regard, as a method of replacing each of hydrogen atoms in the gate insulating film 3 with a deuterium atom, for example, (A) a method of applying heat treatment to the gate insulating film 3 in the atmosphere including deuterium gas ($D_2$) after forming the gate insulating film 3; (B) a method of applying thermal oxidation to the semiconductor substrate 2 in the atmosphere including heavy water vapor ($D_2O$) when forming the gate insulating film 3; (C) a method of applying heat treatment to the gate insulating film 3 in the atmosphere including deuterated ammonia ($ND_3$) after forming the gate insulating film 3; or the like may be mentioned. One kind of these methods or combination of two or more kinds of these methods can be utilized as the method of replacing each of hydrogen atoms in the gate insulating film 3 with a deuterium atom.

Figure 4C:
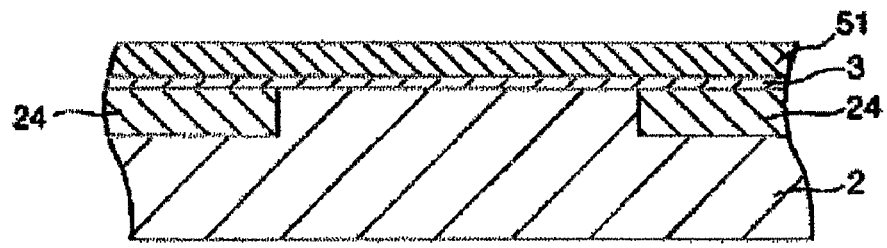

<4> Next, as shown in FIG. 4C, a conductive film 51 is formed on the gate insulating film 3. The conductive film 51 can be formed by depositing polycrystalline silicon or the like on the gate insulating film 3 with the CVD method, for example.

Figure 4D:
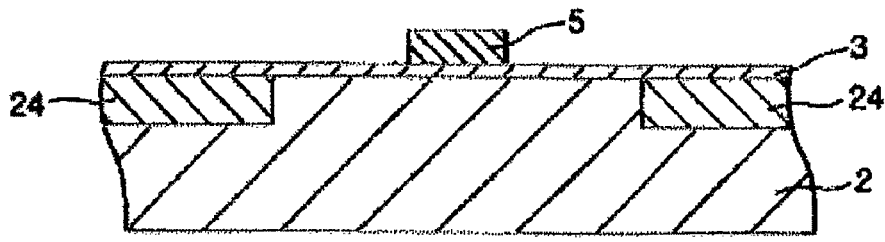

<5> Next, a resist mask corresponding to the shape of the gate insulating film 3 is formed on the conductive film 51 with a photolithography method or the like, for example. Then, unwanted portions of the conductive film 51 are eliminated via the resist mask with etching. Thus, it is possible to obtain the gate electrode 5 as shown in FIG. 4D. As this etching, physical etching method such as plasma etching, reactive etching, beam etching, photo assisted etching, chemical etching method such as wet etching, or the like may be mentioned. Further, one kind of these etching methods or combination of two or more kinds of these etching methods can be utilized as the etching.

Figure 4E:
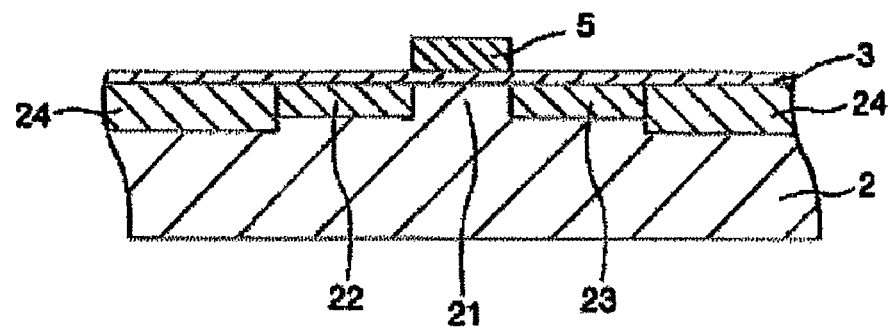

<6> Next, as shown in FIG. 4E, the source region 22 and the drain region 23 are formed by carrying out ion doping into both sides of the gate electrode 5 in the semiconductor substrate 2. At this time, in the case of forming the well with p-type impurities, the source region 22 and the drain region 23 are formed by doping n-type impurities such as $P^+$ into the both sides of the gate electrode 5. On the other hand, in the case of forming the well with n-type impurities, the source region 22 and the drain region 23 are formed by doping p-type impurities such as $B^+$ into the both sides of the gate electrode 5.

Figure 4F:
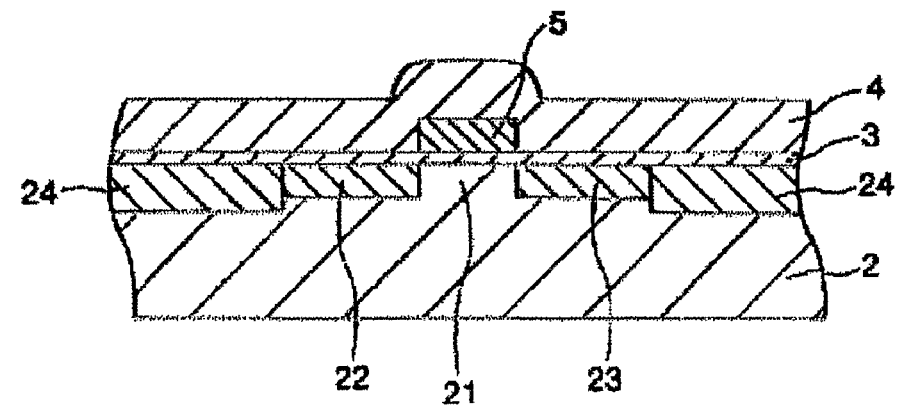

<7> Next, as shown in FIG. 4F, the interlayer insulating film 4 is formed by depositing $SiO_2$ or the like on the semiconductor substrate 2 on which the respective portions are formed with a CVD method or the like.

Figure 4G:
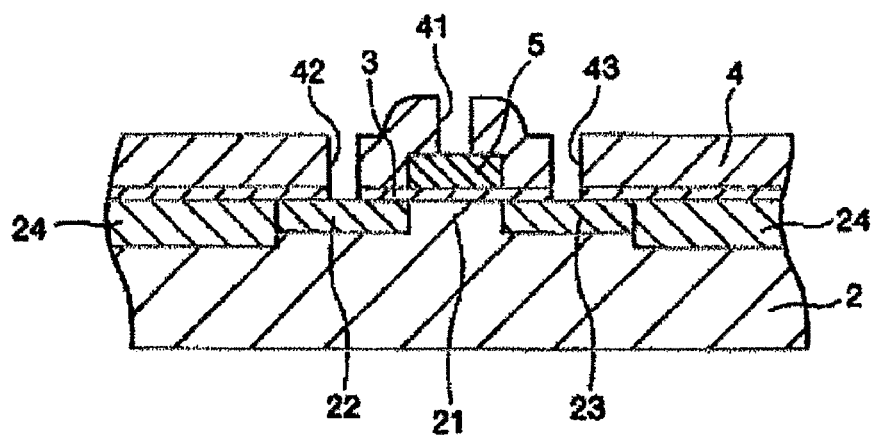

<8> Next, a resist mask in which portions corresponding to the contact holes opens is formed on the interlayer insulating film 4 with a photolithography method or the like, for example. Then, unwanted portions of the interlayer insulating film 4 are eliminated via the resist mask with etching. Thus, as shown in FIG. 4G, the contact holes 41, 42, and 43 are formed so as to correspond to the channel region 21, the source region 22, and the drain region 23, respectively.

<9> Next, a conductive film is formed by depositing a conductive material on the interlayer insulating film 4 including the insides of the contact holes 41, 42, and 43 with a CVD method or the like, for example.

Figure 4H:
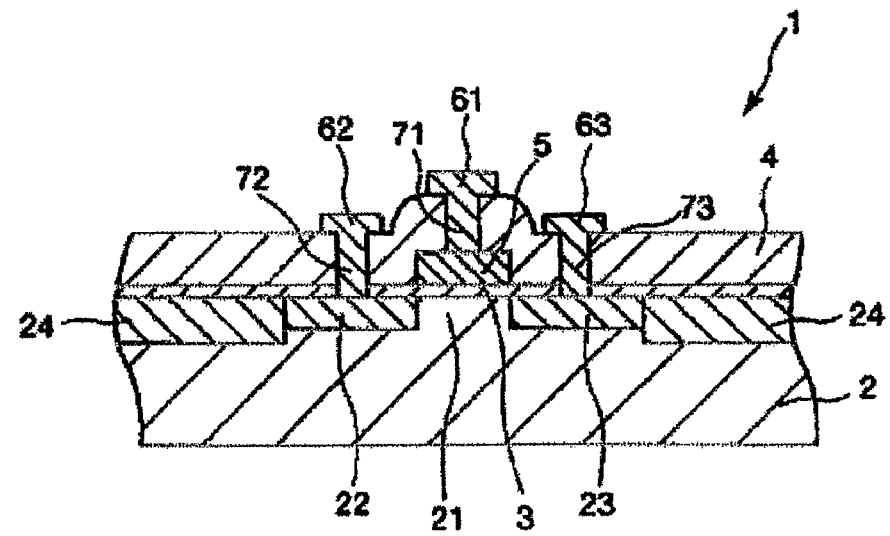

<10> Next, a resist mask corresponding to the shape of the conductive portion is formed on the conductive film with a photolithography method or the like, for example. Then, unwanted portions of the conductive film are eliminated via the resist mask with etching. Thus, as shown in FIG. 4H, the conductive portions 61, 62, and 63 and the contact plugs 71, 72, and 73 are formed so as to correspond to the channel region 21, the source region 22, and the drain region 23, respectively.

Through the steps described above, the semiconductor device 1 is manufactured.

<Electronic Device>

The semiconductor device 1 described above is applied to various types of electronic devices. Hereinafter, a case where an electronic device of the present invention including the semiconductor device 1 of the present invention is applied to a transmission liquid crystal display (LCD) will now be described as a representative example.

Figure 5:
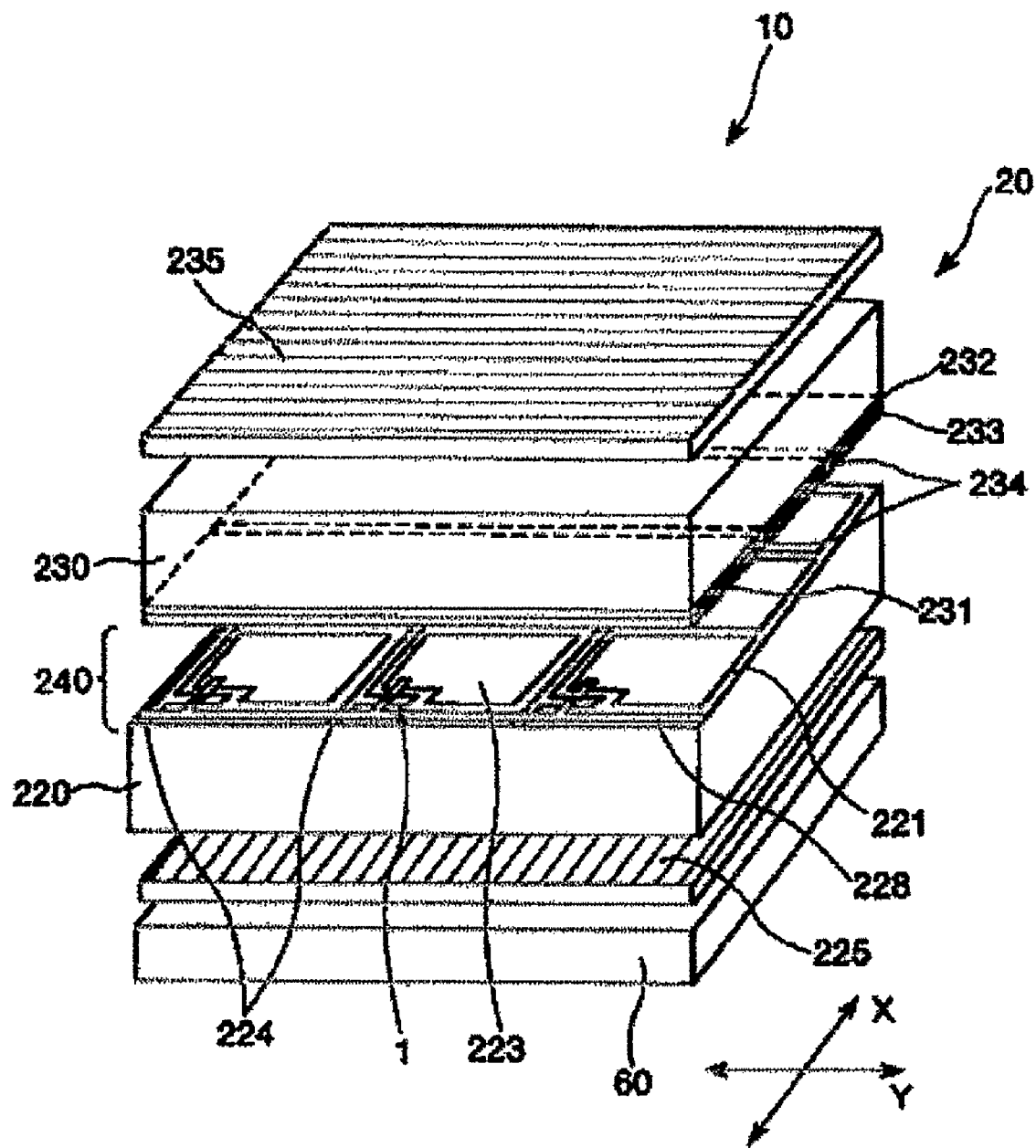
FIG. 5 is an exploded perspective view which shows an embodiment of an electronic device in the case of applying an electronic device of the present invention to a transmission liquid crystal display.

FIG. 5 is an exploded perspective view which shows an embodiment of an electronic device in the case of applying an electronic device of the present invention to a transmission liquid crystal display. In this regard, some members (components) of the transmission LCD in FIG. 5 are omitted in order to avoid complication of the drawings. Further, in following explanations using FIG. 5, for convenience of explanation, an upper side and lower side in FIG. 5 are referred to as "upper" and "lower," respectively.

This transmission liquid crystal display 10 shown in FIG. 5 (hereinafter, the transmission liquid crystal display 10 will be referred to simply as "liquid crystal display 10") includes a liquid crystal panel (display panel) 20, and a backlight (light source) 60. The liquid crystal display 10 can display an image (information) by transmitting light from the backlight 60 to the liquid crystal panel 20. The liquid crystal panel 20 has a first plate 220 and a second plate 230 that are provided so as to face each other. Further, a seal member (not shown) is provided between the first and second plate 220, 230 so that a display area is surrounded by the seal member.

A liquid crystal that is an electro-optical material is received in a space defined by the first plate 220, the second plate 230, and the seal member, thereby forming a liquid crystal layer (intermediary layer) 240. Namely, the liquid crystal layer 240 is inserted between the first plate 220 and the second plate 230.

Although illustrative representation is omitted, an orientational film constituted from polyimide, for example, is provided on each of upper and lower surfaces of the liquid crystal layer 240. Orientation (orientational direction) of liquid crystal molecules constituting the liquid crystal layer 240 is controlled by these orientational films.

Each of the first plate 220 and the second plate 230 is formed of one of various kinds of glass materials, various kinds of resin materials, and the like, for example. The first plate 220 is provided with a plurality of picture electrodes 223 arranged in a matrix manner on the top surface 221 thereof (that is, the surface facing the liquid crystal layer 240), scanning lines 224 each extending in an X direction of FIG. 5, and signal lines 228 each extending in a Y direction of FIG. 5.

Each of the picture electrodes 223 is constituted from a transparent conductive film having transparency (optical transparency), and connected to one scanning line 224 and one signal line 228 via one semiconductor device (that is, a semiconductor device of the present invention) 1. A polarizing plate 225 is provided on the lower surface of the first plate 220. On the other hand, the second plate 220 is provided with opposing electrodes 232 constituted from a plurality of strip on the lower surface 231 thereof (that is, the surface facing the liquid crystal layer 240). These opposing electrodes 232 are arranged in substantially parallel to each other so as to space by a predetermined distance each other and to face the picture electrode 223.

A portion where the picture electrode 223 and the opposing electrode 232 are overlapped each other (which includes an adjacent portion) constitutes one pixel. By charging and discharging between the picture electrode 223 and the opposing electrode 232, in every pixel, the liquid crystal of the liquid crystal layer 240 is driven, that is, an orientational state of the liquid crystal is changed.

The opposing electrode 232 is also constituted from a transparent conductive film having transparency (optical transparency) as well as the picture electrode 223. Each of three colored layers including red (R), green (G) and blue (B) (color filter) 233 is provided on the lower surface of each of the opposing electrodes 232. These colored layers 233 are divided by a black matrix 234.

The black matrix 234 has a light blocking effect, and is formed of, for example, a metal such as chromium, aluminum, aluminum alloy, nickel, zinc, titanium, or a resin in which carbon or the like is dispersed. Further, a polarizing plate 235 of which the deflecting axis is different from that of the polarizing plate 225 is provided on the upper surface of the second plate 230.

In the liquid crystal panel 20 having such a structure, light emitting from the backlight 60 enters the liquid crystal layer 240 through the first plate 220 and the picture electrodes 223 after deflected with the polarizing plate 225. The intensity of the light entering the liquid crystal layer 240 is modulated with the liquid crystal in which an orientational state of each of pixel is controlled. The intensity-modulated light passes through the colored layer 233, the opposing electrodes 232 and the second plate 230, and then deflected with the polarizing plate 235 to exit outside the liquid crystal display 10. Thus, in the liquid crystal display 10, it is possible to view a color image (including both a moving image and a still image) such as letter, numeric character, and figure (graphic form) from the opposite side to the liquid crystal layer 240 of the second plate 230.

In this regard, in the explanation described above, a case where the electronic device of the present invention is applied to an active matrix driving type of transmission liquid crystal device has been described as a representative example. However, the present invention is not limited thereto. In addition, it is possible to apply the electronic device of the present invention to a reflective liquid crystal display, organic or inorganic electroluminescence display, and an electrophoretic display.

<Electronic Device>

The liquid crystal display 10 described above (electronic device of the present invention) can be utilized as a display portion of each of various types of electronic apparatuses.

Figure 6:
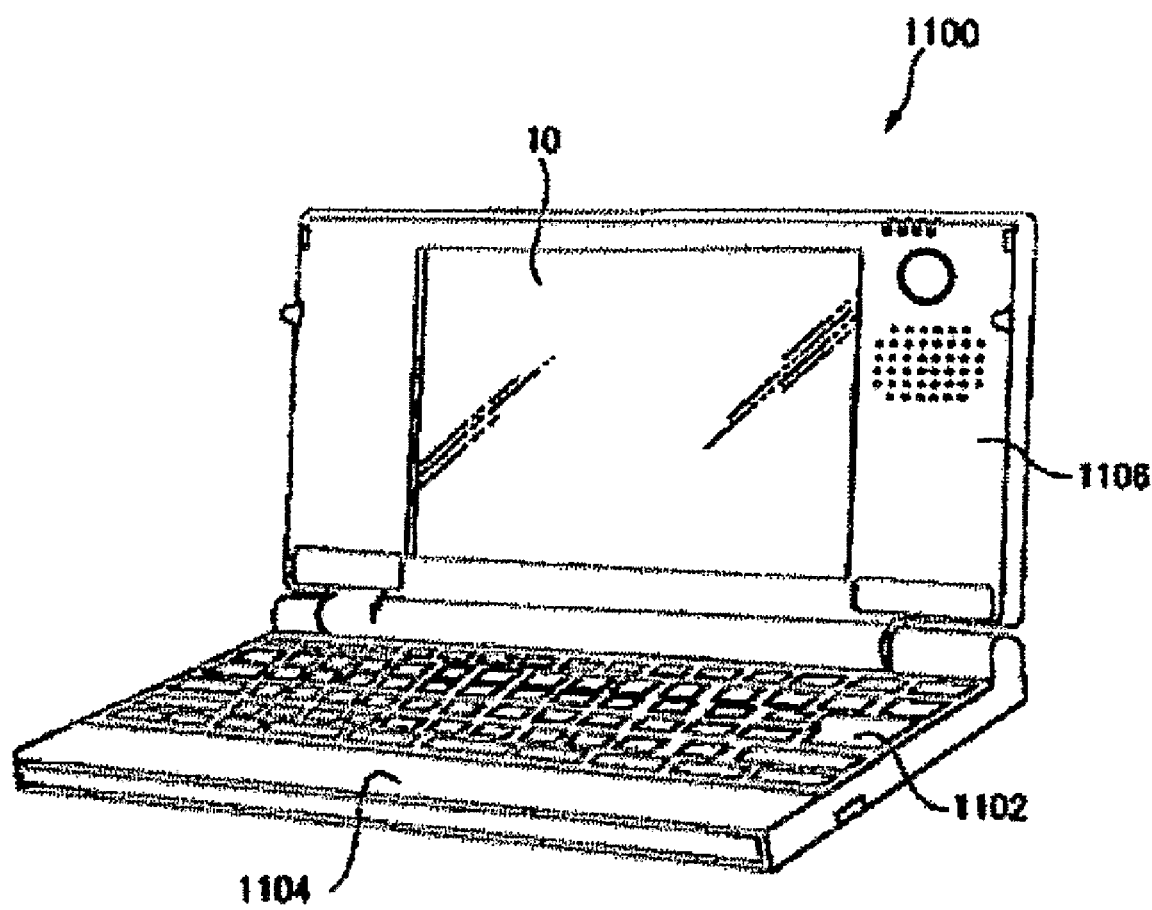
FIG. 6 is a perspective view which shows a structure of a mobile (or laptop type) personal computer to which an electronic apparatus of the present invention is applied.

FIG. 6 is a perspective view which shows a structure of a mobile (or laptop type) personal computer to which an electronic apparatus of the present invention is applied. Referring to FIG. 6, a personal computer 1100 is provided with a body 1104 having a keyboard 1102, and a display unit 1106. The display unit 1106 is rotatably supported on the body 1104 via a hinge portion. In this personal computer 1100, the display unit 1106 is provided with the liquid crystal display (electro-optical device) 10 described above.

Figure 7:
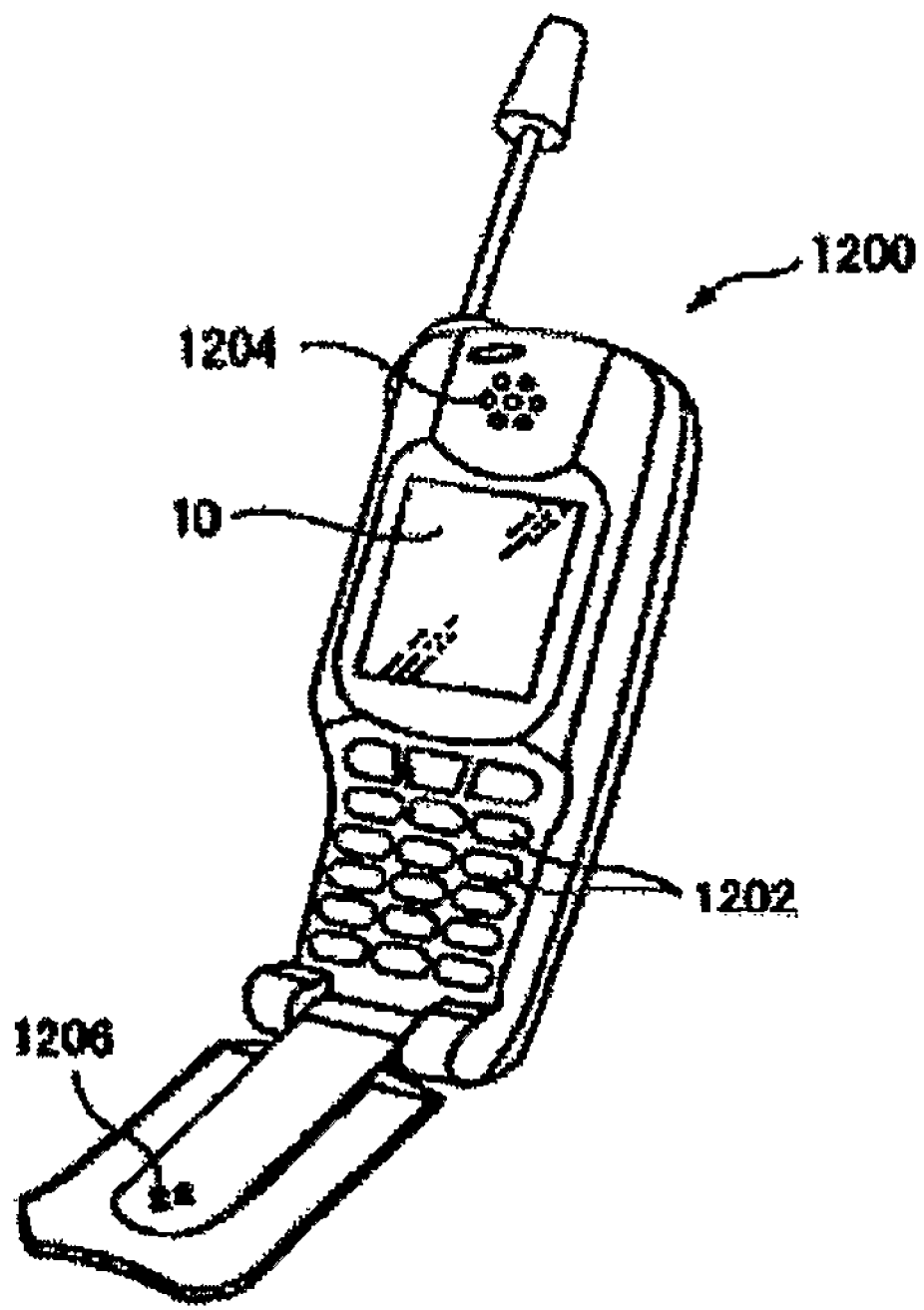
FIG. 7 is a perspective view which shows a structure of a portable phone (including a personal handy phone system) to which an electronic apparatus of the present invention is applied.

FIG. 7 is a perspective view which shows a structure of a portable phone (including a personal handy phone system) to which an electronic apparatus of the present invention is applied. Referring to FIG. 7, a portable phone 1200 is provided with a plurality of buttons 1202, an earpiece 1204, a mouthpiece 1206, and a display portion. The display portion is constituted from the liquid crystal display (electro-optical device) 10 described above.

Figure 8:
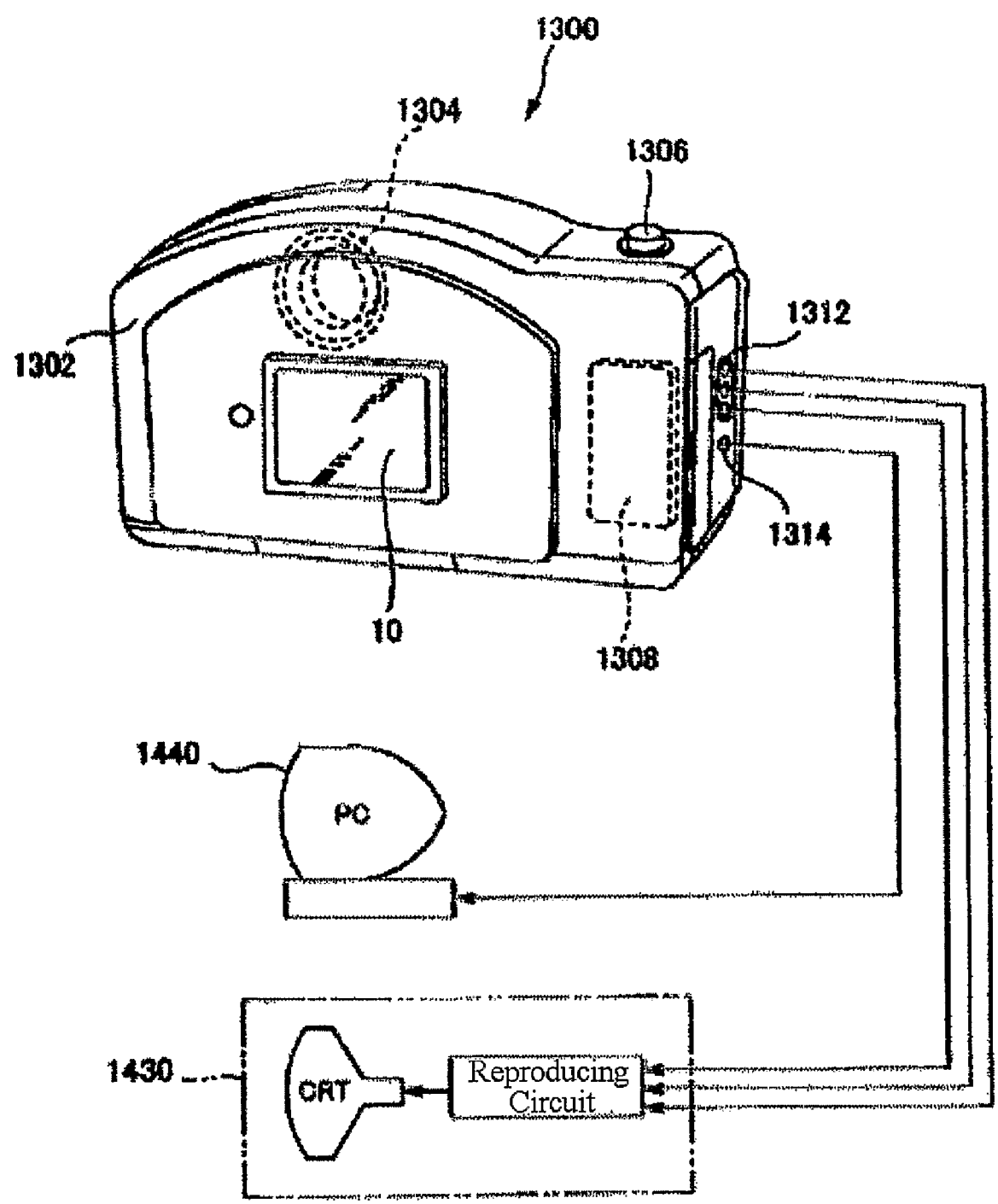
FIG. 8 is a perspective view which shows a structure of a digital still camera to which an electronic apparatus of the present invention is applied.

FIG. 8 is a perspective view which shows a structure of a digital still camera to which an electronic apparatus of the present invention is applied. In this drawing, connection of the digital still camera to external equipments thereof is schematically shown. A normal camera exposes a silver salt photographic film on the basis of an optical image of a subject, while the digital still camera 1300 generates an imaging signal (image signal) by photoelectrically converting an optical image of a subject into the imaging signal with imaging device such as a charge coupled device (CCD).

The liquid crystal display 10 described above is provided as a display portion on the back surface of a case (body) 1302 in the digital still camera 1300. The liquid crystal display 10 displays an image in response to an imaging signal by the CCD, and serves as a finder for displaying a subject as an electronic image. A circuit board 1308 is placed inside the case 1302. A memory capable of storing an imaging signal is placed on the circuit board 1308.

Further, a light receiving unit 1304 including an optical lens (imaging optical system), the CCD, and the like is provided in the front surface side of the case 1302. When a photographer confirms an image of a subject displayed on the display portion, and pushes a shutter button 1306, an imaging signal of the CCD at the time is transferred to the memory of the circuit board 1308 and stored in this memory.

Further, a video signal output terminal 1312 and a input/output terminal 1314 for data communication are provided on the side surface of the case 1302 in the digital still camera 1300. As shown in FIG. 8, a television monitor 1430 and a personal computer 1440 are respectively connected to the video signal output terminal 1312 and the input/output terminal 1314 for data communication if needed. Moreover, the imaging signal stored in the memory of the circuit board 1308 is outputted to the television monitor 1430 or the personal computer 1440 with a predetermined operation.

In this regard, the electronic apparatus of the present invention can be suitably used in (or applied to), for example, televisions, video cameras, view finder type or monitor direct view type videotape recorders, laptop type personal computers, car navigation devices, pagers, electronic notebooks (including those having communication functions), electronic dictionaries, pocket calculators, electronic game devices, word processors, work stations, television telephones, television monitors for crime prevention, electronic binoculars, POS (point-of-sale) terminals, apparatuses with touch panel (for example, cash dispensers in a financial institutions, automatic ticket vending machines), medical devices (electronic thermometers, blood pressure meters, blood sugar meters, electrocardiogram displaying devices, ultrasound diagnostic devices, displays for endoscopes, for example), fish finders, various measurement devices, gauges (gauges for vehicles, airplanes, ships and the like, for example), flight simulators, any other types of monitors, projection type displays such as projectors and the like, in addition to the personal computer (mobile personal computer) 1100 shown in FIG. 6, the portable phone 1200 shown in FIG. 7 and the digital still camera 1300 shown in FIG. 8.

The semiconductor device, the electronic device, and the electronic apparatus according to the present invention have been described based on the embodiment shown in the drawings, but it should be noted that the present invention is not limited to the embodiment. Respective portions of the semiconductor device, the electronic device, and the electronic apparatus can be replaced with an arbitrary arrangement capable of functioning in the same manner. Further, any other arbitrary component may be added to the semiconductor device, the electronic device, and the electronic apparatus of the present invention.

EXAMPLE

Next, a concrete example of the present invention will be described.

1. Manufacturing and Evaluation of Insulating Film 1-1. Manufacturing of Insulating Film First, ten insulating films were prepared in each of five kinds of insulating films A to E that will be described below.

<Insulating Film A>

-1- A surface direction (100) p-type silicon crystal substrate (Si(100) substrate) was first prepared.

The silicon crystal substrate was subject to a thermal oxidation process, and then a silicon oxynitride film (foundation layer) was formed with a CVD method. The thermal oxidation process was carried out in the atmosphere of water vapor ($H_2O$) having relative humidity of 33% RH at 750° C. Further, the CVD method was carried out for 40 minutes at 650° C. when the pressure in a chamber was 0.02 Pa and a gas of dichlorosilane ammonia was continually supplied into the chamber.

The thickness of the obtained silicon oxynitride film was 10 nm. In this regard, a leakage current in this silicon oxynitride film was extremely high ($1 \times 10^{-5}$ $A/cm^2$ or more) when a voltage (applied voltage) was applied to the silicon oxynitride film so that the electric field intensity in the silicon oxynitride film was in the range of 5 to 10 MV/cm.

-2- Next, a silicon oxide film was formed on this silicon oxynitride film with a CVD method. In this regard, the CVD method was carried out for 60 minutes at 650° C. when the pressure in the chamber was atmosphere pressure and a mixed gas of dichlorosilane ($SiHCl_2$) and oxygen ($O_2$) was continually supplied into the chamber. The average thickness of the obtained silicon oxide film was 3.7 nm.

-3- Next, this silicon oxide film was subject to heat treatment that was carried out in the atmosphere of water vapor ($H_2O$) having relative humidity of 95% RH at 900° C. for five minutes. By carrying out the steps as described above, an insulating film A was obtained.

<Insulating Films B to D>

By carrying out the steps as well as the method of forming the insulating film A described above except that the condition of the heat treatment in the step -3- described above, an insulating films B to D were obtained.

<Insulating Film E>

By carrying out the steps as well as the method of forming the insulating film A described above except that the step -3- described above was omitted, an insulating film E was obtained.

<Insulating Film F>

By carrying out the steps as well as the method of forming the insulating film A described above except for the atmosphere of heavy water vapor ($D_2O$) in place of the atmosphere of water vapor ($H_2O$) in the step -3- described above, an insulating film F was obtained.

<Insulating Film G>

By carrying out the steps as well as the method of forming the insulating film A described above except to form a silicon oxynitride film with the CVD method in the step -2- described above, an insulating film G was obtained.

<Insulating Film H>

By carrying out the steps as well as the method of forming the insulating film A described above except to form a hafnium silicate film with the CVD method in the step -2- described above, an insulating film H was obtained.

<Insulating Film I>

By carrying out the steps as well as the method of forming the insulating film A described above except to form a zirconium silicate film with the CVD method in the step -2- described above and the atmosphere of water vapor ($H_2O$) was replaced with the atmosphere of nitrogen gas ($N_2$) in the step -3- described above, an insulating film I was obtained.

<Insulating Film J>

By carrying out the steps as well as the method of forming the insulating film A described above except to form an aluminum silicate film with the CVD method in the step -2- described above and the atmosphere of water vapor ($H_2O$) was replaced with the atmosphere of nitrogen gas ($N_2$) in the step -3- described above, an insulating film J was obtained.

TABLE 1

| Insulating Film | | Heating Conditions | | | Film Thickness (Average) (nm) |
| --- | --- | --- | --- | --- | --- |
| | | Temp. (° C.) | Time (min.) | GAS CONTENT (% RH) | |
| IF A | silicon oxide film | 900 | 20 | 95 | 3.7 |
| IF B | silicon oxide film | 700 | 15 | 95 | 3.8 |
| IF C | silicon oxide film | 500 | 10 | 95 | 3.8 |
| IF D | silicon oxide film | 200 | 5 | 95 | 3.6 |
| IF E | silicon oxide film | —(RT) | — | — | 3.9 |
| IF F | silicon oxide film (deuterated) | 900 | 20 | 95 | 3.6 |
| IF G | silicon oxynitride film | 900 | 20 | 95 | 4.1 |
| IF H | hafnium silicate film | 900 | 20 | 95 | 3.8 |
| IF I | zirconium silicate film (nitrogen-containing) | 900 | 20 | 95 | 4.0 |
| IF J | zirconium silicate film (nitrogen-containing) | 900 | 20 | 95 | 3.9 |

1-2. Evaluation for Insulating Film 1-2-1. Analysis Using Thermal Desorption Spectroscopy The intensity of the $H_2$ fragment (M/z=2:[$H_2$]) and the intensity of the OH fragment (M/z=17: [OH]) were analyzed with Thermal Desorption Spectroscopy method (TDS method) with respect to each of the insulating films A to J by heating each insulating film from 80 to 1000° C. In this case, the measurement conditions of the TDS method were as follows.

| TDS apparatus | WA1000S (made by Electronic Science (Denshikagaku-sha) |
| --- | --- |
| start temperature: | 80° C. |
| final temperature: (temperature of stage) | 1000° C. |
| programming rate: | 60° C./min. |
| pressure of measured atmosphere: | $1 \times 10^{-7}$ Pa |

Figure 9:
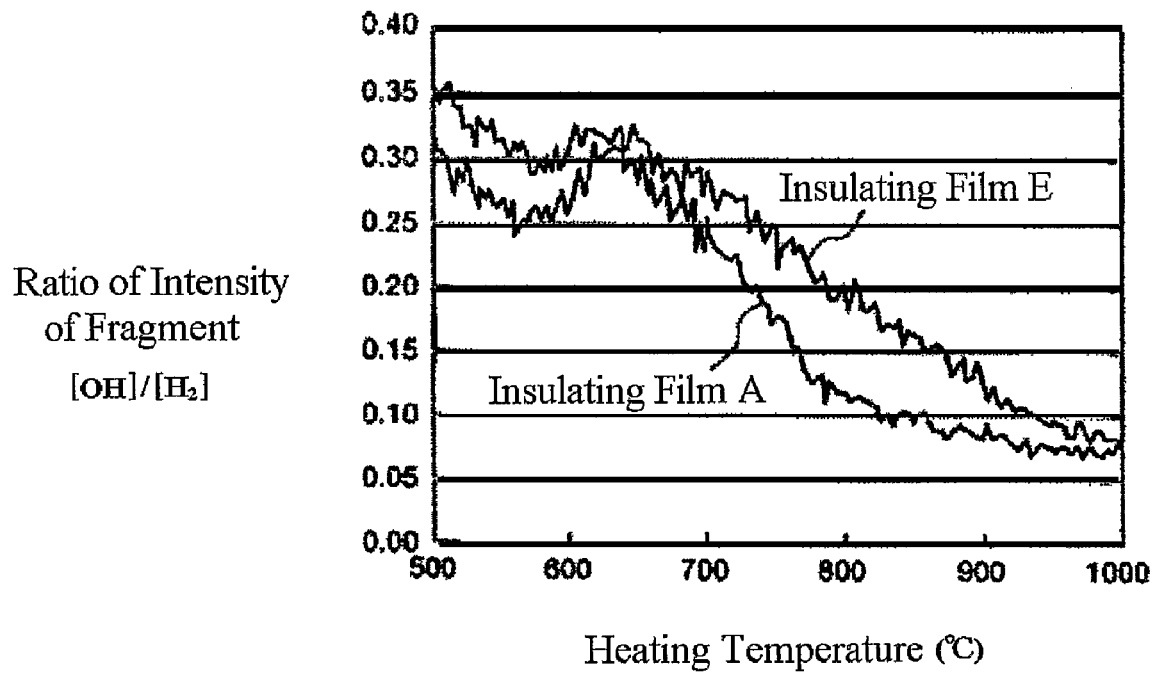
FIG. 9 is a drawing which shows the ratio ([OH]/[$H_2$]) of the intensity of the $H_2$ fragment [$H_2$] and the intensity of an OH fragment [OH] with respect to a heating temperature that is obtained when the insulating films A and E are analyzed by Thermal Desorption Spectroscopy.

The ratios ([OH]/[$H_2$]) of the intensity of the $H_2$ fragment [$H_2$] and the intensity of the OH fragment [OH] obtained with the TDS method at heating temperature of 450, 600, 800 and 950° C. with respect to each of the insulating films A to J are shown in TABLE 2 described below. In this regard, each of the numerical values in TABLE 2 is an average value of the ten insulating films of each of the insulating films A to J. As an example, the infrared absorption spectra (the relation between the ratios ([OH]/[$H_2$]) with respect to a heating temperature in the insulating films A and E are shown in FIG. 9. FIG. 9 is a drawing which shows the ratio ([OH]/[$H_2$]) of the intensity of the $H_2$ fragment [$H_2$] and the intensity of an OH fragment [OH] with respect to a heating temperature that is obtained when the insulating films A and E are analyzed by Thermal Desorption Spectroscopy.

TABLE 2

| | [OH]/[$H_2$] | | | |
| --- | --- | --- | --- | --- |
| | 450° C. | 600° C. | 800° C. | 950° C. |
| IF A | $4.5 \times 10^{-1}$ | $2.6 \times 10^{-1}$ | $1.2 \times 10^{-1}$ | $7.5 \times 10^{-2}$ |
| IF B | $5.5 \times 10^{-1}$ | $2.7 \times 10^{-1}$ | $1.3 \times 10^{-1}$ | $8.1 \times 10^{-2}$ |
| IF C | $5.2 \times 10^{-1}$ | $2.7 \times 10^{-1}$ | $1.6 \times 10^{-1}$ | $8.7 \times 10^{-2}$ |
| IF D | $4.2 \times 10^{-1}$ | $2.9 \times 10^{-1}$ | $1.8 \times 10^{-1}$ | $9.5 \times 10^{-2}$ |
| IF E | $4.9 \times 10^{-1}$ | $3.0 \times 10^{-1}$ | $2.0 \times 10^{-1}$ | $1.0 \times 10^{-1}$ |
| IF F | $5.5 \times 10^{-1}$ | $2.6 \times 10^{-1}$ | $1.2 \times 10^{-1}$ | $7.3 \times 10^{-2}$ |
| IF G | $5.3 \times 10^{-1}$ | $2.5 \times 10^{-1}$ | $1.1 \times 10^{-1}$ | $7.3 \times 10^{-2}$ |
| IF H | $4.2 \times 10^{-1}$ | $2.6 \times 10^{-1}$ | $1.2 \times 10^{-1}$ | $7.4 \times 10^{-2}$ |
| IF I | $4.4 \times 10^{-1}$ | $2.7 \times 10^{-1}$ | $1.3 \times 10^{-1}$ | $7.9 \times 10^{-2}$ |
| IF J | $5.0 \times 10^{-1}$ | $2.7 \times 10^{-1}$ | $1.2 \times 10^{-1}$ | $7.6 \times 10^{-2}$ |

1-2-2. Measurement of Leakage Current

Next, changes in the leakage current values were measured with respect to each of the insulating films A to J when the electric field intensity (that is, the applied voltage value) to each insulating film was changed. In this case, the measured area was determined to be 0.02039 $cm^2$.

Figure 10:
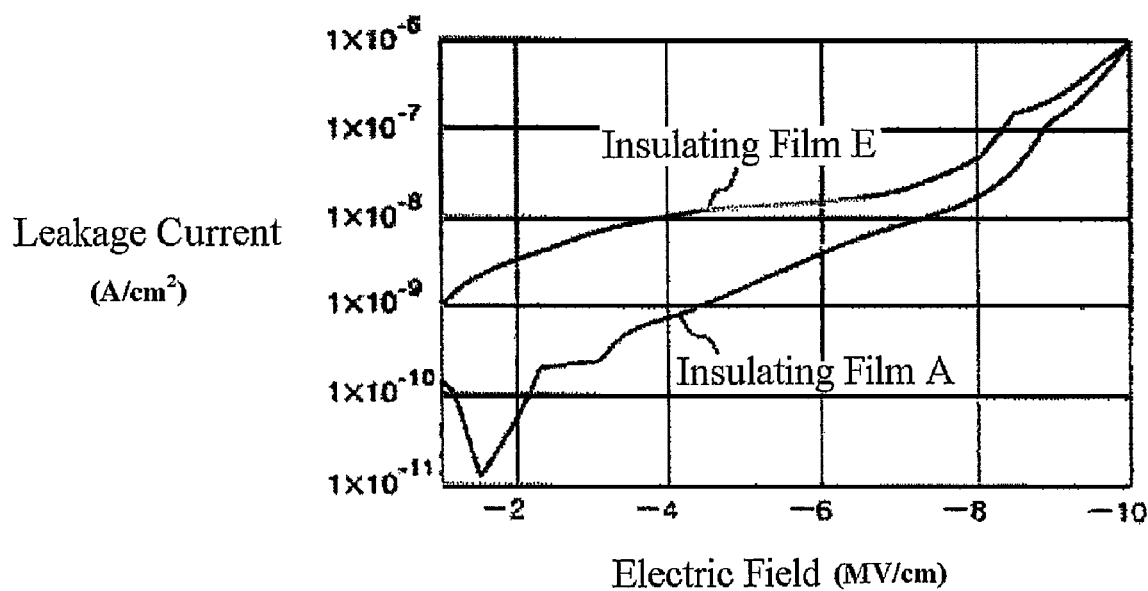
FIG. 10 is a drawing which shows the relation between the change in an electric field measured in the insulating films A and E and the change in a leakage current.

The maximum values of the leakage current measured when the electric field intensity was in the range of 0 to −5 MV/cm in the insulating films A to J are shown in TABLE 3 described below. In this regard, each of the numerical values in TABLE 3 is an average value of the ten insulating films. As an example, the changes in the electric field intensity and the change in the leakage current value measured in the insulating films A and E are shown in FIG. 10. FIG. 10 is a drawing which shows the relation between the change in an electric field measured in the insulating films A and E and the change in a leakage current.

TABLE 3

| Insulating Film | | Maximum Value of Leakage Current (A/$cm^2$) |
| --- | --- | --- |
| IF A | silicon oxide film | $3 \times 10^{-9}$ |
| IF B | silicon oxide film | $4 \times 10^{-9}$ |
| IF C | silicon oxide film | $8 \times 10^{-9}$ |
| IF D | silicon oxide film | $1 \times 10^{-8}$ |
| IF E | silicon oxide film | $2 \times 10^{-8}$ |
| IF F | silicon oxide film (deuterated) | $2 \times 10^{-9}$ |
| IF G | silicon oxynitride film | $2 \times 10^{-9}$ |
| IF H | hafnium silicate film | $3 \times 10^{-9}$ |
| IF I | zirconium silicate film (nitrogen-containing) | $4 \times 10^{-9}$ |
| IF J | zirconium silicate film (nitrogen-containing) | $3 \times 10^{-9}$ |

As shown in TABLES 2 and 3, the ratio ([OH]/[$H_2$]) when each of the silicon oxide films of the insulating films A to E was heated at the temperature of 500° C. or more shows a tendency to increase at any heating temperature as the maximum value of the leakage current increases. On the other hand, in the ratio ([OH]/[$H_2$]) when each of the insulating films A to E was heated at the temperature of 450° C. (that is, at the temperature of 500° C. or less) the correlation with respect to the increase of the maximum value of the leakage current was not found.

This makes it clear that the ratio ([OH]/[$H_2$]) when each of the silicon oxide films of the insulating films A to E was heated at the temperature within the range of 500 to 1000° C. correlates with the maximum value of the leakage current (characteristic value). Further, with respect to each of the insulating films the integration value ($\Sigma$([OH]/[$H_2$])) of the ratio ([OH]/[H$_2$]) when each insulating film was heated at the temperature within the range of 500 to 1000° C. and the integration value (Σ([OH]/[H$_2$])) of the ratio ([OH]/[H$_2$]) when each insulating film was heated at the temperature within the range of 500° C. or less were obtained to carry out examination (analysis) similar to the case of the ratio ([OH]/[H$_2$]). The result that the integration value (Σ([OH]/[H$_2$])) of the ratio ([OH]/[H$_2$]) when each insulating film was heated at the temperature within the range of 500 to 1000° C. correlates with the maximum value of the leakage current (characteristic value) was obtained.

It was found that the comparison result (the ratio or the integration value of the ratio) of the intensity of an H$_2$ fragment with the intensity of an OH fragment measured at a state where the insulating film is heated at a temperature in the range of 500 to 1000° C. correlates with the characteristic value of each insulating film (that is, the maximum value of the leakage current). As a result, it was clear that such a comparison result could be utilized to an evaluation method when setting conditions of forming an insulating film or when carrying out quality inspection of the insulating film.

In this regard, in the case of evaluating an insulating film using the ratio ([OH]/[H$_2$]) when the heating temperature was 800° C., the ratio of the insulating film C, that is, 0.16 may be used as a threshold used in carrying out quality inspection of an insulating film because the maximum value of the leakage current in each of the insulating films D and E exceeds 9×10$^{-9}$ A/cm$^2$ and the maximum value of the leakage current in the insulating film C is 8×10$^{-9}$ A/cm$^2$.

Further, as shown in TABLES 2 and 3, the relation between the ratio ([OH]/[H$_2$] or [OD]/[D$_2$]) and the maximum value of a leakage current in each of the insulating film F in which each hydrogen atom in at least a part of the hydrogen atoms is replaced with a deuterium atom D and the insulating films G to J each containing other element in addition to silicon and oxygen shows a tendency similar to the corresponding relation in the insulating film A under the same conditions of heat treatment. Thus, it was clear that the characteristics of each of the insulating films F to J could be evaluated by means of the evaluation method of the present invention.

1-2-3. Measurement of Qbd value

Next, the Qbd value was measured with respect to each of the insulating films A to J. Here, the "Qbd value" means an integration value of the leakage current which flows through each insulating film in the thickness direction thereof until a dielectric breakdown occurs therein. The larger the Qbd value is, the more difficultly a dielectric breakdown occurs in the insulating film. In this measurement of the Qbd value, when a constant current is supplied to an insulating film using mercury electrodes, a time point when a small change in voltage occurs first time is determined to be the SBD, and a time point when a drastic change in voltage occurs is determined to be the HBD. An integration value (Qbd value (SBD)) of the leakage current that has flowed through the insulating film until a SBD occurs and an integration value (Qbd value (HBD)) of the leakage current that has flowed through the insulating film until a HBD occurs were measured. In this case, the measured area was determined to be 0.02039 cm$^2$, and a constant current value applied to the insulating film was determined to be 0.01226 A/cm$^2$.

The Qbd value (SBD) and the Qbd value (HBD) thus measured in each of the insulating films A to J are shown in TABLE 4 described below. In this regard, each of the numerical values in TABLE 4 is an average value of the ten insulating films.

TABLE 4

| Insulating Film | | Qbd value (C./cm$^2$) | |
|---|---|---|---|
| | | SBD | HBD |
| IF A | silicon oxide film | 83 | 272 |
| IF B | silicon oxide film | 78 | 215 |
| IF C | silicon oxide film | 45 | 168 |
| IF D | silicon oxide film | 33 | 88 |
| IF E | silicon oxide film | 18 | 39 |
| IF F | silicon oxide film (deuterated) | 88 | 331 |
| IF G | silicon oxynitride film | 92 | 369 |
| IF H | hafnium silicate film | 80 | 257 |
| IF I | zirconium silicate film (nitrogen-containing) | 76 | 234 |
| IF J | zirconium silicate film (nitrogen-containing) | 79 | 245 |

As shown in TABLE 4, the larger the Qbd value (SBD) and Qbd value (HBD) of each of the insulating films A to J were, the smaller the ratio ([OH]/[H$_2$]) when each of the insulating films A to J was heated at a temperature in the range of 500° C. or more was. Thus, it was found that the Qbd value (SBD) and the Qbd value (HBD) of each insulating film correlated with the ratio ([OH]/[H$_2$]) thereof. As a result, it was clear that the resistance to a dielectric breakdown (that is, SBD and HBD) of an insulating film could be estimated from the ratio ([OH]/[H$_2$]) thereof as well as the leakage current value thereof.

2. Manufacturing and Evaluation of Semiconductor Device 2-1. Manufacturing of Semiconductor Device The semiconductor device shown in FIG. 1 was manufactured in accordance with the method described in the above embodiment. In this case, the gate insulating film was formed as well as the insulating films A to J described above.

2-2. Evaluation for Semiconductor Device

The switching characteristics of each semiconductor device were examined. As a result, good switching characteristics were obtained for a long time in the semiconductor device including each of the gate insulating films formed in the same manner as the insulating films A to C and F to J. In this regard, in each of these insulating films A to C and F to J the ratio ([OH]/[H$_2$]) when each insulating film was heated at 800° C. was 0.16 or less.

On the other hand, in the semiconductor device including each of the gate insulating films formed in the same manner as the insulating films D and E, a leakage current was recognized and the switching characteristics were unstable. Thus, a dielectric breakdown occurred in the gate insulating film early, and a function as a switching device was lost. In this regard, in each of these insulating films D and E the ratio ([OH]/[H$_2$]) when each insulating film was heated at 800° C. was 0.16 or more.

The invention claimed is:

1. A method of evaluating characteristics of an insulating film, the insulating film being formed of an insulative inorganic material as a main material, the insulative inorganic material containing silicon and oxygen, and the insulating film containing hydrogen atoms, the method comprising the steps of:

analyzing the insulating film to which an electric field has never been applied by Thermal Desorption Spectroscopy;

comparing intensity of an H$_2$ fragment with intensity of an OH fragment, the intensity of the H$_2$ fragment and the intensity of the OH fragment being measured at a state where the insulating film is heated at a temperature in the range of 500 to 1000° C.;

evaluating the characteristics of the insulating film on the basis of the comparison result; and wherein in the comparing step the comparison result is obtained using the ratio ([OH]/[$H_2$]) of the intensity of the $H_2$ fragment [$H_2$] and the intensity of the OH fragment [OH] at a predetermined temperature within the range of 500 to 1000° C. or the integration value ($\Sigma$([OH]/[$H_2$])) of the ratio ([OH]/[$H_2$]) as an index, and in the evaluating step the characteristics of the insulating film is evaluated on the basis of the comparison result.

2. The method as claimed in claim 1, wherein the evaluating step includes the step of estimating one or more characteristic value of the insulating film that correlates with the comparison result wherein the characteristics of the insulating film are evaluated on the basis of the one or more estimated characteristic value.

3. The method as claimed in claim 2, wherein the one or more estimated characteristic value includes the value of a leakage current to be measured when an electric field is applied to the insulating film and the integration value (hereinafter, referred to as "Qbd value") of the leakage current that would have flowed through the insulating film until a dielectric breakdown occurs therein, wherein the characteristics of the insulating film to be evaluated includes resistance to a dielectric breakdown of the insulating film.

4. The method as claimed in claim 1, wherein in the evaluating step the insulating film is evaluated to have an acceptable quality in the case where the ratio ([OH]/[$H_2$]) or the integration value ($\Sigma$([OH]/[$H_2$])) of the ratio ([OH]/[$H_2$]) of the insulating film is less than a predetermined threshold.

5. The method as claimed in claim 1, wherein in the insulating film each hydrogen atom in at least a part of the hydrogen atoms is replaced with a deuterium atom D.

6. The method as claimed in claim 5, wherein the $H_2$ fragment [$H_2$] of which the hydrogen atoms are respectively replaced with the deuterium atoms is defined as a $D_2$ fragment [$D_2$] and the OH fragment of which the hydrogen atom is replaced with the deuterium atom is defined as a OD fragment [OD], wherein in the comparing step the comparison result is obtained using the ratio ([OD]/[$D_2$]) of the intensity of the $D_2$ fragment [$D_2$] and the intensity of the OD fragment [OD] at a predetermined temperature within the range of 500 to 1000° C. or the integration value ($\Sigma$([OD]/[$D_2$]) )of the ratio ([OD]/[$D_2$]) as an index, and in the evaluating step the characteristics of the insulating film is evaluated on the basis of the comparison result.

7. The method as claimed in claim 1, wherein the insulative inorganic material further includes at least one of nitrogen, hafnium, zirconium and aluminum in addition to silicon and oxygen.

8. The method as claimed in claim 1, wherein the average thickness of the insulating film is 10 nm or less.

9. The method as claimed in claim 1, wherein the insulating film is adapted to be used under the condition that a voltage is applied to the insulating film in its thickness direction so that the electric field intensity in the insulating film is 10 MV/cm or less.

10. A method of forming an insulating film used for a semiconductor device, the method comprising the steps of:
setting conditions of forming the insulating film on the basis of the evaluation result obtained by means of the evaluation method defined by claim 1; and
forming the insulating film under the conditions.

11. A method of forming an insulating film used for a semiconductor device, the method comprising the steps of:
setting conditions of forming the insulating film on the basis of the evaluation result obtained by means of the evaluation method defined by claim 1, wherein the conditions are set so that the ratio ([OH]/[$H_2$]) or the integration value (2([OH]/[$H_2$])) of the ratio ([OH]/[$H_2$]) of the evaluated insulating film becomes smaller; and
forming the insulating film under the conditions.

12. The method as claimed in claim 11, wherein in the setting step the conditions are set on the basis of whether or not the ratio ([OH]/[$H_2$]) or the integration value ($\Sigma$([OH]/[$H_2$])) of the ratio ([OH]/[$H_2$]) of the evaluated insulating film is less than a predetermined threshold.

13. The method as claimed in claim 12, wherein the conditions include whether or not the insulating film is subjected to heat treatment, and conditions of the heat treatment in the case where the insulating film is subjected to the heat treatment.

14. A semiconductor device comprising the insulating film formed by means of the method defined by claim 10.

15. An electronic device comprising the semiconductor device defined by claim 14.

16. An electronic apparatus comprising the electronic device defined by claim 15.

17. A semiconductor device comprising the insulating film formed by means of the method defined by claim 11.

* * * * *